(12) United States Patent
Lin et al.

(10) Patent No.: US 11,705,877 B2
(45) Date of Patent: Jul. 18, 2023

(54) ADVANCED GAIN SHAPING FOR ENVELOPE TRACKING POWER AMPLIFIERS

(71) Applicant: Skyworks Solutions, Inc., Irvine, CA (US)

(72) Inventors: Yu-Jui Lin, Westlake Village, CA (US); Wei Zhang, Oak Park, CA (US); David Steven Ripley, Marion, IA (US); Vignesh Sridharan, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 190 days.

(21) Appl. No.: 17/305,111

(22) Filed: Jun. 30, 2021

(65) Prior Publication Data

US 2021/0384880 A1 Dec. 9, 2021

Related U.S. Application Data

(63) Continuation of application No. 16/802,935, filed on Feb. 27, 2020, now Pat. No. 11,082,021.

(Continued)

(51) Int. Cl.
*H04B 1/04* (2006.01)
*H03F 1/02* (2006.01)
(Continued)

(52) U.S. Cl.
CPC ......... *H03G 3/3042* (2013.01); *H03F 1/0233* (2013.01); *H03F 3/245* (2013.01);
(Continued)

(58) Field of Classification Search
CPC ........ H03F 1/02; H03F 1/0205; H03F 1/0213; H03F 1/0233; H03F 3/245;
(Continued)

(56) References Cited

U.S. PATENT DOCUMENTS 5,455,542 A 10/1995 Spence et al.
5,459,762 A 10/1995 Wang et al.
(Continued)

FOREIGN PATENT DOCUMENTS

WO WO 2018/052539 3/2018
WO WO 2021/061851 4/2021

OTHER PUBLICATIONS

International Preliminary Report on Patentability and Written Opinion for International Application No. PCT/US2020/052315 dated Mar. 15, 2022, in 6 pages.

(Continued)

*Primary Examiner* — Blane J Jackson
(74) *Attorney, Agent, or Firm* — Knobbe, Martens, Olson & Bear, LLP

(57) ABSTRACT

Envelope tracking power amplifiers with advanced gain shaping are provided. In certain implementations, a power amplifier system includes a power amplifier that amplifies a radio frequency (RF) signal and an envelope tracker that controls a voltage level of a supply voltage of the power amplifier based on an envelope of the RF signal. The power amplifier system further includes a gain shaping circuit that generates a gain shaping current that changes with the voltage level of the supply voltage from the envelope tracker. For example, the gain shaping circuit can include an analog look-up table (LUT) mapping a particular voltage level of the supply voltage to a particular current level of gain shaping current. Additionally, the gain shaping circuit biases the power amplifier based on the gain shaping current.

20 Claims, 21 Drawing Sheets

Related U.S. Application Data

(60) Provisional application No. 62/866,155, filed on Jun. 25, 2019, provisional application No. 62/814,429, filed on Mar. 6, 2019.

(51) Int. Cl.
*H03G 3/30* (2006.01)
*H03F 3/24* (2006.01)
*H04B 1/40* (2015.01)

(52) U.S. Cl.
CPC ......... *H04B 1/40* (2013.01); *H03F 2200/105* (2013.01); *H03F 2200/451* (2013.01); *H03G 2201/103* (2013.01); *H03G 2201/307* (2013.01)

(58) Field of Classification Search
CPC ....... H03F 2200/105; H04B 1/02; H04B 1/04; H04B 2201/0408; H04B 2001/0451; H04B 2001/40
See application file for complete search history.

(56) References Cited

U.S. PATENT DOCUMENTS

| | | | |
|---|---|---|---|
| 5,724,657 A | 3/1998 | Lin et al. | |
| 5,761,250 A | 6/1998 | Lin | |
| 6,204,734 B1 | 3/2001 | Zhang et al. | |
| 6,438,365 B1 | 8/2002 | Balteanu | |
| 6,639,470 B1 | 10/2003 | Andrys et al. | |
| 6,671,500 B2 | 12/2003 | Damgaard et al. | |
| 6,704,560 B1 | 3/2004 | Balteanu et al. | |
| 6,734,729 B1 | 5/2004 | Andrys et al. | |
| 6,768,382 B1 | 7/2004 | Shie et al. | |
| 6,842,067 B2 | 1/2005 | Andrys et al. | |
| 6,977,976 B1 | 12/2005 | Birkett et al. | |
| 7,136,003 B1 | 11/2006 | Ripley et al. | |
| 7,142,053 B2 | 11/2006 | Phillips et al. | |
| 7,193,474 B2 | 3/2007 | Phillips et al. | |
| 7,276,973 B2 | 10/2007 | Ripley et al. | |
| 7,288,991 B2 | 10/2007 | Ripley | |
| 7,385,442 B1 | 6/2008 | Ripley | |
| 7,397,089 B2 | 7/2008 | Zhang et al. | |
| 7,408,413 B2 | 8/2008 | Ripley | |
| 7,414,479 B2 | 8/2008 | Ripley et al. | |
| 7,443,246 B2 | 10/2008 | Andrys et al. | |
| 7,482,868 B2 | 1/2009 | Hageman et al. | |
| 7,496,339 B2 | 2/2009 | Balteanu et al. | |
| 7,538,606 B2 | 5/2009 | Ripley | |
| 7,589,592 B2 | 9/2009 | Fisher et al. | |
| 7,605,651 B2 | 10/2009 | Ripley et al. | |
| 7,696,826 B2 | 4/2010 | Ripley et al. | |
| 7,876,160 B2 | 1/2011 | Zhang et al. | |
| 7,994,861 B2 | 8/2011 | Fisher et al. | |
| 8,023,909 B2 | 9/2011 | Ripley et al. | |
| 8,049,565 B2 | 11/2011 | Zhang et al. | |
| 8,140,028 B2 | 3/2012 | Balteanu et al. | |
| 8,154,345 B2 | 4/2012 | Andrys et al. | |
| 8,188,793 B2 | 5/2012 | Ripley et al. | |
| 8,330,546 B2 | 12/2012 | Ripley et al. | |
| 8,351,873 B2 | 1/2013 | Balteanu et al. | |
| 8,362,840 B2 | 1/2013 | Andrys et al. | |
| 8,421,539 B2 | 4/2013 | Zhang et al. | |
| 8,493,141 B2 | 7/2013 | Khlat et al. | |
| 8,514,016 B2 | 8/2013 | Ripley et al. | |
| 8,519,788 B2 | 8/2013 | Khlat | |
| 8,526,995 B2 | 9/2013 | Ripley et al. | |
| 8,537,579 B2 | 9/2013 | Ripley et al. | |
| 8,598,953 B2 | 12/2013 | Fisher et al. | |
| 8,611,836 B2 | 12/2013 | Ripley et al. | |
| 8,634,789 B2 | 1/2014 | Chang et al. | |
| 8,644,777 B2 | 2/2014 | Ripley et al. | |
| 8,666,337 B2 | 3/2014 | Ripley et al. | |
| 8,717,100 B2 | 5/2014 | Reisner et al. | |
| 8,718,188 B2 | 5/2014 | Balteanu et al. | |
| 8,719,459 B2 | 5/2014 | Ripley | |
| 8,774,739 B2 | 7/2014 | Ripley et al. | |
| 8,786,371 B2 | 7/2014 | Popplewell et al. | |
| 8,791,719 B2 | 7/2014 | Ripley | |
| 8,824,991 B2 | 9/2014 | Chang et al. | |
| 8,829,993 B2 | 9/2014 | Briffa et al. | |
| 8,928,426 B2 | 1/2015 | Li et al. | |
| 8,928,427 B2 | 1/2015 | Li et al. | |
| 8,941,449 B2 | 1/2015 | Li et al. | |
| 8,948,712 B2 | 2/2015 | Chen et al. | |
| 8,981,847 B2 | 3/2015 | Balteanu | |
| 8,983,406 B2 | 3/2015 | Zhang et al. | |
| 8,989,682 B2 | 3/2015 | Ripley et al. | |
| 9,030,259 B2 | 5/2015 | Fisher et al. | |
| 9,041,472 B2 | 5/2015 | Chen et al. | |
| 9,042,854 B2 | 5/2015 | Wang et al. | |
| 9,054,575 B2 | 6/2015 | Ripley et al. | |
| 9,054,663 B2 | 6/2015 | Reisner et al. | |
| 9,071,335 B2 | 6/2015 | Agarwal et al. | |
| 9,083,282 B2 | 7/2015 | Zhang et al. | |
| 9,083,455 B2 | 7/2015 | Popplewell et al. | |
| 9,092,393 B2 | 7/2015 | Whitefield et al. | |
| 9,106,183 B2 | 8/2015 | Liu et al. | |
| 9,116,183 B2 | 8/2015 | Cummins et al. | |
| 9,118,277 B2 | 8/2015 | Balteanu et al. | |
| 9,136,795 B2 | 9/2015 | Liu et al. | |
| 9,143,096 B2 | 9/2015 | Balteanu et al. | |
| 9,189,430 B2 | 11/2015 | Ross et al. | |
| 9,197,128 B2 | 11/2015 | Popplewell et al. | |
| 9,202,747 B2 | 12/2015 | Chen et al. | |
| 9,203,529 B2 | 12/2015 | Chen et al. | |
| 9,214,387 B2 | 12/2015 | Chen et al. | |
| 9,214,979 B2 | 12/2015 | Ripley | |
| 9,225,298 B2 | 12/2015 | Ripley et al. | |
| 9,231,528 B2 | 1/2016 | Granger-Jones et al. | |
| 9,231,533 B2 | 1/2016 | Zhang et al. | |
| 9,288,098 B2 | 3/2016 | Yan et al. | |
| 9,294,043 B2 | 3/2016 | Ripley et al. | |
| 9,294,054 B2 | 3/2016 | Balteanu et al. | |
| 9,295,157 B2 | 3/2016 | Chen et al. | |
| 9,305,859 B2 | 4/2016 | Williams et al. | |
| 9,374,045 B2 | 6/2016 | Zhang et al. | |
| 9,391,648 B2 | 7/2016 | Popplewell et al. | |
| 9,418,950 B2 | 8/2016 | Zhang et al. | |
| 9,419,567 B2 | 8/2016 | Ripley et al. | |
| 9,425,833 B2 | 8/2016 | Popplewell et al. | |
| 9,445,371 B2 | 9/2016 | Khesbak et al. | |
| 9,450,639 B2 | 9/2016 | Zhang et al. | |
| 9,451,566 B1 | 9/2016 | Morshedi et al. | |
| 9,455,669 B2 * | 9/2016 | Modi .................. H03G 3/3042 |
| 9,467,940 B2 | 10/2016 | Zhang et al. | |
| 9,473,019 B2 | 10/2016 | Ripley et al. | |
| 9,473,073 B2 | 10/2016 | Liu et al. | |
| 9,490,827 B2 | 11/2016 | Wang et al. | |
| 9,503,025 B2 | 11/2016 | Cao et al. | |
| 9,506,968 B2 | 11/2016 | Hoang et al. | |
| 9,515,029 B2 | 12/2016 | Chen et al. | |
| 9,520,835 B2 | 12/2016 | Ko et al. | |
| 9,543,919 B2 | 1/2017 | Ripley | |
| 9,571,049 B2 | 2/2017 | Zhang et al. | |
| 9,571,152 B2 | 2/2017 | Ripley et al. | |
| 9,584,070 B2 | 2/2017 | Balteanu et al. | |
| 9,588,529 B2 | 3/2017 | Balteanu et al. | |
| 9,602,060 B2 | 3/2017 | Gorbachov et al. | |
| 9,602,064 B2 | 3/2017 | Wu et al. | |
| 9,606,947 B2 | 3/2017 | Ross et al. | |
| 9,621,034 B2 | 4/2017 | Liu et al. | |
| 9,621,118 B2 | 4/2017 | Ripley et al. | |
| 9,646,936 B2 | 5/2017 | Chen et al. | |
| 9,660,584 B2 | 5/2017 | Modi et al. | |
| 9,667,200 B2 | 5/2017 | Ripley | |
| 9,668,215 B2 | 5/2017 | Balteanu et al. | |
| 9,673,707 B2 | 6/2017 | Popplewell et al. | |
| 9,678,528 B2 | 6/2017 | Ripley | |
| 9,679,869 B2 | 6/2017 | Petty-Weeks et al. | |
| 9,692,357 B2 | 6/2017 | Hoang et al. | |
| 9,698,736 B2 | 7/2017 | Ripley | |
| 9,698,740 B2 | 7/2017 | Lin et al. | |
| 9,698,832 B2 | 7/2017 | Popplewell et al. | |

(56) References Cited

U.S. PATENT DOCUMENTS

| | | |
|---|---|---|
| 9,698,853 B2 | 7/2017 | Andrys et al. |
| 9,703,913 B2 | 7/2017 | Chen et al. |
| 9,712,125 B2 | 7/2017 | Lehtola et al. |
| 9,712,196 B2 | 7/2017 | Ripley et al. |
| 9,712,197 B2 | 7/2017 | Ripley et al. |
| 9,722,547 B2 | 8/2017 | Ripley et al. |
| 9,735,737 B2 | 8/2017 | Gorbachov et al. |
| 9,748,985 B2 | 8/2017 | Zhang et al. |
| 9,768,740 B2 | 9/2017 | Zhang et al. |
| 9,774,300 B2 | 9/2017 | Jin et al. |
| 9,780,741 B2 | 10/2017 | Ripley et al. |
| 9,806,395 B2 | 10/2017 | Li et al. |
| 9,806,676 B2 | 10/2017 | Balteanu et al. |
| 9,806,679 B2 | 10/2017 | Gorbachov et al. |
| 9,831,765 B2 | 11/2017 | Liu et al. |
| 9,831,834 B2 | 11/2017 | Balteanu et al. |
| 9,831,841 B2 | 11/2017 | Wu et al. |
| 9,837,965 B1 | 12/2017 | Wagh et al. |
| 9,838,058 B2 | 12/2017 | Pehlke et al. |
| 9,843,293 B1 | 12/2017 | Wagh et al. |
| 9,847,755 B2 | 12/2017 | Sun et al. |
| 9,853,620 B2 | 12/2017 | Gorbachov et al. |
| 9,871,599 B2 | 1/2018 | Chen et al. |
| 9,876,471 B2 | 1/2018 | Modi et al. |
| 9,876,473 B2 | 1/2018 | Khesbak et al. |
| 9,887,668 B2 | 2/2018 | Zampardi, Jr. et al. |
| 9,893,682 B2 | 2/2018 | Zhu et al. |
| 9,893,686 B2 | 2/2018 | Ripley |
| 9,899,961 B2 | 2/2018 | Lehtola et al. |
| 9,905,902 B2 | 2/2018 | Zhang et al. |
| 9,912,233 B2 | 3/2018 | Liu et al. |
| 9,929,694 B2 | 3/2018 | Ripley |
| 9,935,582 B2 | 4/2018 | Balteanu et al. |
| 9,935,677 B2 | 4/2018 | Puente et al. |
| 9,948,241 B2 | 4/2018 | Popplewell et al. |
| 9,966,982 B2 | 5/2018 | Ripley et al. |
| 9,971,377 B2 | 5/2018 | Balteanu et al. |
| 9,973,088 B2 | 5/2018 | Balteanu et al. |
| 9,985,592 B2 | 5/2018 | Gorbachov et al. |
| 9,990,322 B2 | 6/2018 | Whitefield et al. |
| 9,991,856 B2 | 6/2018 | Khesbak et al. |
| 10,033,277 B2 | 7/2018 | Ripley et al. |
| 10,033,385 B2 | 7/2018 | Ripley |
| 10,038,406 B2 | 7/2018 | Liu et al. |
| 10,041,987 B2 | 8/2018 | Hoang et al. |
| 10,044,400 B2 | 8/2018 | Zhang et al. |
| 10,050,529 B2 | 8/2018 | Pehlke et al. |
| 10,061,885 B2 | 8/2018 | Chen et al. |
| 10,063,200 B2 | 8/2018 | Wu et al. |
| 10,080,192 B2 | 9/2018 | Balteanu et al. |
| 10,090,811 B2 | 10/2018 | Ripley et al. |
| 10,090,812 B2 | 10/2018 | Modi et al. |
| 10,097,216 B2 | 10/2018 | Gorbachov et al. |
| 10,103,726 B2 | 10/2018 | Wilz et al. |
| 10,116,274 B2 | 10/2018 | Ripley et al. |
| 10,135,408 B2 | 11/2018 | Cao et al. |
| 10,141,901 B2 | 11/2018 | Zhang et al. |
| 10,147,994 B2 | 12/2018 | Jayaraman et al. |
| 10,181,820 B2 | 1/2019 | Balteanu et al. |
| 11,082,021 B2 * | 8/2021 | Lin ............... H03F 3/245 |
| 11,133,782 B2 | 9/2021 | Birkbeck et al. |
| 11,239,800 B2 | 2/2022 | Drogi et al. |
| 11,444,576 B2 | 9/2022 | Drogi et al. |
| 11,482,975 B2 | 10/2022 | Lyalin et al. |
| 2007/0268074 A1 | 11/2007 | Vejzovic |
| 2008/0051042 A1 | 2/2008 | Komaili et al. |
| 2008/0101263 A1 | 5/2008 | Barber et al. |
| 2009/0040671 A1 | 2/2009 | Zhang |
| 2009/0206932 A1 | 8/2009 | Wu |
| 2010/0197365 A1 | 8/2010 | Ripley et al. |
| 2011/0025422 A1 | 2/2011 | Marra et al. |
| 2011/0043284 A1 | 2/2011 | Zhao et al. |
| 2011/0128761 A1 | 6/2011 | Ripley et al. |
| 2011/0181364 A1 | 7/2011 | Ahadian et al. |
| 2012/0019335 A1 | 1/2012 | Hoang et al. |
| 2012/0119840 A1 | 5/2012 | Sanduleanu et al. |
| 2012/0139643 A1 | 6/2012 | Scott et al. |
| 2012/0154036 A1 | 6/2012 | Oh et al. |
| 2012/0200338 A1 | 8/2012 | Olson |
| 2012/0200354 A1 | 8/2012 | Ripley et al. |
| 2012/0269240 A1 | 10/2012 | Balteanu et al. |
| 2013/0207731 A1 | 8/2013 | Balteanu |
| 2013/0285750 A1 | 10/2013 | Chowdhury et al. |
| 2013/0310114 A1 | 11/2013 | Zohny et al. |
| 2014/0184334 A1 | 7/2014 | Nobbe et al. |
| 2014/0266448 A1 | 9/2014 | Cha et al. |
| 2014/0327483 A1 | 11/2014 | Balteanu |
| 2015/0061770 A1 | 3/2015 | Luo et al. |
| 2015/0145596 A1 | 5/2015 | Fagg |
| 2015/0145604 A1 | 5/2015 | Scott et al. |
| 2015/0171796 A1 | 6/2015 | Matsui |
| 2015/0236651 A1 | 8/2015 | Yang et al. |
| 2015/0236652 A1 | 8/2015 | Yang et al. |
| 2015/0270806 A1 | 9/2015 | Wagh et al. |
| 2015/0280655 A1 | 10/2015 | Nobbe et al. |
| 2015/0365052 A1 | 12/2015 | Barton et al. |
| 2016/0014935 A1 | 1/2016 | Agarwal et al. |
| 2016/0027571 A1 | 1/2016 | Zhang et al. |
| 2016/0094254 A1 | 3/2016 | Ripley |
| 2016/0163661 A1 | 6/2016 | Chen et al. |
| 2016/0241210 A1 | 8/2016 | Andrys et al. |
| 2016/0241292 A1 | 8/2016 | Ripley |
| 2016/0241299 A1 | 8/2016 | Ripley |
| 2016/0242057 A1 | 8/2016 | Ripley et al. |
| 2016/0248381 A1 | 8/2016 | Yang |
| 2016/0294328 A1 | 10/2016 | Kondo et al. |
| 2016/0329866 A1 | 11/2016 | Gorbachov et al. |
| 2017/0005629 A1 | 1/2017 | Yang et al. |
| 2017/0040955 A1 | 2/2017 | Yang et al. |
| 2017/0085223 A1 | 3/2017 | Miol et al. |
| 2017/0093505 A1 | 3/2017 | Ripley et al. |
| 2017/0094607 A1 | 3/2017 | Ripley |
| 2017/0099059 A1 | 4/2017 | Wang et al. |
| 2017/0126185 A1 | 5/2017 | Kang et al. |
| 2017/0131734 A1 | 5/2017 | Balteanu et al. |
| 2017/0149437 A1 | 5/2017 | Luo et al. |
| 2017/0160318 A1 | 6/2017 | Zhang et al. |
| 2017/0162705 A1 | 6/2017 | Gorbachov et al. |
| 2017/0163218 A1 | 6/2017 | Gorbachov et al. |
| 2017/0163226 A1 | 6/2017 | Gorbachov et al. |
| 2017/0195972 A1 | 7/2017 | Drogi et al. |
| 2017/0223632 A1 | 8/2017 | Balteanu et al. |
| 2017/0228332 A1 | 8/2017 | Ross et al. |
| 2017/0264253 A1 | 9/2017 | Gorbachov et al. |
| 2017/0271301 A1 | 9/2017 | Petty-Weeks et al. |
| 2017/0271302 A1 | 9/2017 | Petty-Weeks et al. |
| 2017/0271303 A1 | 9/2017 | Petty-Weeks et al. |
| 2017/0277216 A1 | 9/2017 | Ripley |
| 2017/0279350 A1 | 9/2017 | Liu et al. |
| 2017/0294885 A1 | 10/2017 | Kang et al. |
| 2017/0301647 A1 | 10/2017 | Petty-Weeks et al. |
| 2017/0302231 A1 | 10/2017 | Ripley et al. |
| 2017/0317648 A1 | 11/2017 | Gorbachov et al. |
| 2017/0317653 A1 | 11/2017 | Lehtola et al. |
| 2017/0324432 A1 | 11/2017 | Zhang et al. |
| 2017/0338773 A1 | 11/2017 | Balteanu et al. |
| 2017/0346516 A1 | 11/2017 | Ripley et al. |
| 2018/0076772 A1 | 3/2018 | Khesbak et al. |
| 2018/0083578 A1 | 3/2018 | Klaren et al. |
| 2018/0097482 A1 | 4/2018 | Gorbachov et al. |
| 2018/0102753 A1 | 4/2018 | Gorbachov et al. |
| 2018/0123528 A1 * | 5/2018 | Jo ............... H03F 1/32 |
| 2018/0123529 A1 | 5/2018 | Jo et al. |
| 2018/0138574 A1 | 5/2018 | Li et al. |
| 2018/0138862 A1 | 5/2018 | Balteanu et al. |
| 2018/0152945 A1 | 5/2018 | Balteanu |
| 2018/0159476 A1 | 6/2018 | Balteanu et al. |
| 2018/0159478 A1 | 6/2018 | Balteanu et al. |
| 2018/0159577 A1 | 6/2018 | Pehlke et al. |
| 2018/0167037 A1 | 6/2018 | Zhu et al. |
| 2018/0175814 A1 | 6/2018 | Wu et al. |
| 2018/0183389 A1 | 6/2018 | Lehtola et al. |
| 2018/0191050 A1 | 7/2018 | Zhang et al. |
| 2018/0234095 A1 | 8/2018 | Balteanu et al. |

(56) References Cited

U.S. PATENT DOCUMENTS

| | | |
|---|---|---|
| 2018/0262170 A1 | 9/2018 | Gorbachov et al. |
| 2018/0269838 A1 | 9/2018 | Ripley |
| 2018/0278214 A1 | 9/2018 | Jin et al. |
| 2018/0287573 A1 | 10/2018 | Khesbak et al. |
| 2018/0294776 A1 | 10/2018 | Popplewell et al. |
| 2018/0302036 A1 | 10/2018 | Balteanu et al. |
| 2018/0331659 A1 | 11/2018 | Khesbak et al. |
| 2018/0343029 A1 | 11/2018 | Zhang et al. |
| 2018/0351454 A1 | 12/2018 | Khesbak et al. |
| 2018/0351457 A1 | 12/2018 | Ripley |
| 2018/0365365 A1 | 12/2018 | Chen et al. |
| 2018/0375476 A1 | 12/2018 | Balteanu et al. |
| 2018/0375483 A1 | 12/2018 | Balteanu et al. |
| 2019/0020315 A1 | 1/2019 | Khesbak et al. |
| 2019/0028136 A1 | 1/2019 | Zhang et al. |
| 2019/0036524 A1 | 1/2019 | Wilz et al. |
| 2019/0041442 A1 | 2/2019 | Hoang et al. |
| 2019/0044554 A1 | 2/2019 | Gorbachov et al. |
| 2019/0074813 A1 | 3/2019 | Zou et al. |
| 2019/0123690 A1 | 4/2019 | Balteanu et al. |
| 2019/0131684 A1 | 5/2019 | Jayaraman et al. |
| 2019/0158045 A1 | 5/2019 | Zampardi, Jr. et al. |
| 2019/0158046 A1 | 5/2019 | Lehtola et al. |
| 2019/0165736 A1 | 5/2019 | Khesbak et al. |
| 2019/0171785 A1 | 6/2019 | Chen et al. |
| 2019/0173432 A1 | 6/2019 | Van Der Heijden et al. |
| 2019/0181816 A1 | 6/2019 | Ishihara et al. |
| 2019/0190462 A1 | 6/2019 | Zhu et al. |
| 2019/0199434 A1 | 6/2019 | Ripley |
| 2019/0214902 A1 | 7/2019 | Liu et al. |
| 2019/0215774 A1 | 7/2019 | Ripley |
| 2019/0229621 A1 | 7/2019 | Balteanu et al. |
| 2019/0229679 A1 | 7/2019 | Gorbachov et al. |
| 2019/0229682 A1 | 7/2019 | Gorbachov et al. |
| 2019/0245439 A1 | 8/2019 | Pehlke et al. |
| 2019/0273473 A1 | 9/2019 | Gorbachov et al. |
| 2019/0273478 A1 | 9/2019 | Lin et al. |
| 2019/0273480 A1 | 9/2019 | Lin et al. |
| 2019/0288671 A1 | 9/2019 | Ripley et al. |
| 2019/0312328 A1 | 10/2019 | Zhang et al. |
| 2019/0319583 A1* | 10/2019 | El-Hassan ............... H03F 3/245 |
| 2019/0319720 A1 | 10/2019 | Ripley et al. |
| 2019/0331716 A1 | 10/2019 | Zhang et al. |
| 2019/0334564 A1 | 10/2019 | Gorbachov et al. |
| 2019/0341888 A1 | 11/2019 | Drogi et al. |
| 2019/0372526 A1 | 12/2019 | Balteanu et al. |
| 2019/0372628 A1 | 12/2019 | Balteanu et al. |
| 2019/0379332 A1 | 12/2019 | Ripley |
| 2019/0385781 A1 | 12/2019 | Zhang et al. |
| 2019/0386617 A1 | 12/2019 | Naraine et al. |
| 2019/0386698 A1 | 12/2019 | Miol et al. |
| 2020/0007088 A1 | 1/2020 | Ranta |
| 2020/0007177 A1 | 1/2020 | Ripley et al. |
| 2020/0052660 A1 | 2/2020 | Cao et al. |
| 2020/0067406 A1 | 2/2020 | Khesbak et al. |
| 2020/0076393 A1 | 3/2020 | Gorbachov et al. |
| 2020/0083915 A1 | 3/2020 | Zhang et al. |
| 2020/0091820 A1 | 3/2020 | Ripley |
| 2020/0091870 A1 | 3/2020 | Lehtola et al. |
| 2020/0091878 A1 | 3/2020 | Maxim et al. |
| 2020/0099343 A1 | 3/2020 | Khesbak et al. |
| 2020/0103448 A1 | 4/2020 | Hoang et al. |
| 2020/0106399 A1 | 4/2020 | Ripley et al. |
| 2020/0112300 A1 | 4/2020 | Balteanu et al. |
| 2020/0127619 A1 | 4/2020 | Khesbak et al. |
| 2020/0136670 A1 | 4/2020 | Zhang et al. |
| 2020/0154434 A1 | 5/2020 | Balteanu |
| 2020/0159275 A1 | 5/2020 | Ripley |
| 2020/0162028 A1 | 5/2020 | Balteanu et al. |
| 2020/0162030 A1 | 5/2020 | Drogi et al. |
| 2020/0162032 A1 | 5/2020 | Ripley et al. |
| 2020/0162039 A1 | 5/2020 | Lehtola et al. |
| 2020/0195202 A1 | 6/2020 | Gorbachov et al. |
| 2020/0195207 A1 | 6/2020 | Ripley |
| 2020/0259458 A1 | 8/2020 | Balteanu et al. |
| 2020/0259459 A1 | 8/2020 | Balteanu et al. |
| 2020/0321923 A1 | 10/2020 | Park et al. |
| 2020/0335844 A1 | 10/2020 | Jayaraman et al. |
| 2020/0336110 A1 | 10/2020 | Drogi et al. |
| 2020/0336122 A1 | 10/2020 | Lin et al. |
| 2020/0343865 A1 | 10/2020 | Balteanu et al. |
| 2020/0350878 A1 | 11/2020 | Drogi et al. |
| 2021/0028872 A1 | 1/2021 | Cho et al. |
| 2021/0099133 A1 | 4/2021 | Drogi et al. |
| 2021/0099136 A1 | 4/2021 | Drogi et al. |
| 2021/0119582 A1 | 4/2021 | Cappello et al. |
| 2021/0384875 A1 | 12/2021 | Lyalin et al. |
| 2021/0384876 A1 | 12/2021 | Lyalin et al. |
| 2022/0109404 A1 | 4/2022 | Drogi et al. |
| 2023/0017220 A1 | 1/2023 | Lyalin et al. |

OTHER PUBLICATIONS

Balteanu, Florinel "RF Front End Module Architectures for 5G," dated Nov. 2019, in 8 pages.

* cited by examiner

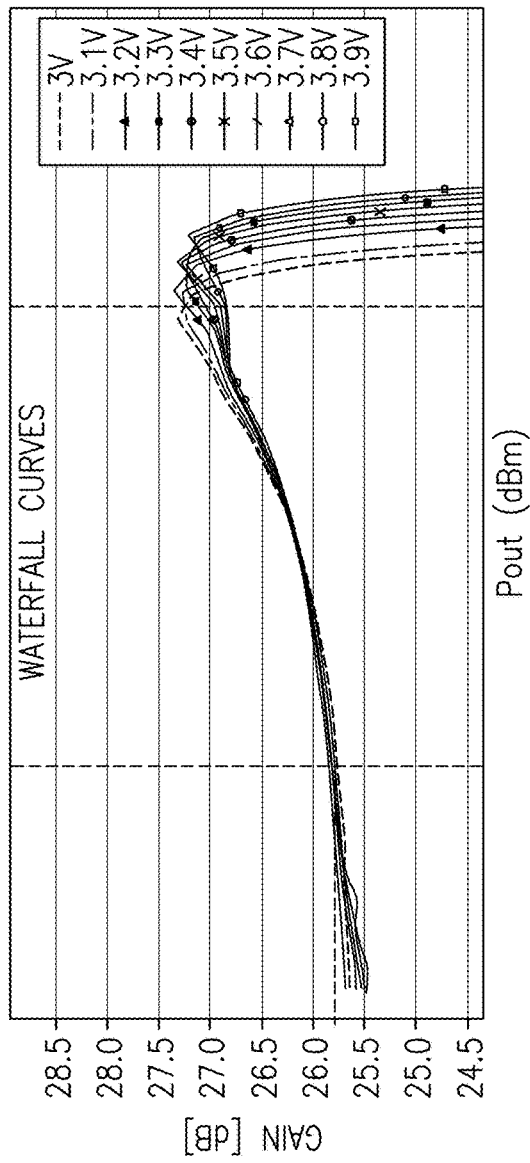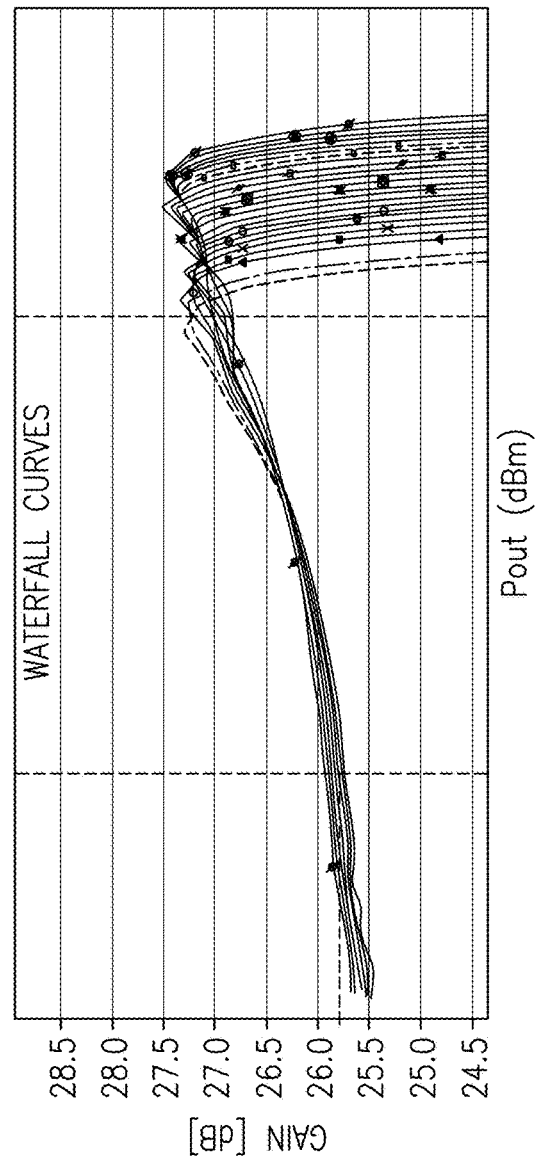

ADVANCED GAIN SHAPING FOR ENVELOPE TRACKING POWER AMPLIFIERS

CROSS-REFERENCE TO RELATED APPLICATIONS

This application is a continuation of U.S. patent application Ser. No. 16/802,935, filed Feb. 27, 2020 and titled "ADVANCED GAIN SHAPING FOR ENVELOPE TRACKING POWER AMPLIFIERS," which claims the benefit of priority under 35 U.S.C. § 119 of U.S. Provisional Patent Application No. 62/866,155, filed Jun. 25, 2019 and titled "ADVANCED GAIN SHAPING FOR ENVELOPE TRACKING POWER AMPLIFIERS," and of U.S. Provisional Patent Application No. 62/814,429, filed Mar. 6, 2019 and titled "ADVANCED GAIN SHAPING FOR ENVELOPE TRACKING POWER AMPLIFIERS," each of which is herein incorporated by reference in its entirety.

BACKGROUND

Technical Field

Embodiments of the invention relate to electronic systems, and in particular, to radio frequency (RF) electronics.

Description of the Related Technology

Power amplifiers are used in RF communication systems to amplify RF signals for transmission via antennas.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for fifth generation (5G) Frequency Range 1 (FR1) communications.

SUMMARY

In certain embodiments, the present disclosure relates to a power amplifier system. The power amplifier system includes a power amplifier configured to amplify a radio frequency signal, an envelope tracker configured to control a voltage level of a supply voltage of the power amplifier based on an envelope of the radio frequency signal, and a gain shaping circuit configured to generate a gain shaping current based on the voltage level of the supply voltage from the envelope tracker, and to bias the power amplifier based on the gain shaping current.

In some embodiments, the gain shaping circuit is operable to map a plurality of supply voltage levels of the supply voltage to a corresponding plurality of current levels of the gain shaping current.

In various embodiments, the gain shaping circuit provides a plurality of different gain expansions for a plurality of different voltage levels of the supply voltage.

In a number of embodiments, the gain shaping circuit reduces the gain shaping current in response to an increase in the voltage level of the supply voltage of the power amplifier.

In several embodiments, the gain shaping circuit includes a plurality of current steering circuits each configured to control the gain shaping current based on a comparison relating to the voltage level of the supply voltage. In accordance with various embodiments, the gain shaping circuit includes a regulator configured to generate a plurality of reference voltages of different voltage levels, and the plurality of current steering circuits are each configured to compare the supply voltage to a corresponding one of the plurality of reference voltages. According to a number of embodiments, the power amplifier system further includes a regulator configured to generate a common reference voltage and a resistor ladder configured to receive the supply voltage and to generate a plurality of scaled supply voltages, and the plurality of current steering circuits are each configured to compare the common reference voltage to a corresponding one of the plurality of scaled supply voltages.

In some embodiments, the gain shaping circuit biases at least one stage of the power amplifier. According to several embodiments, the at least one stage includes a driver stage. In accordance with a number of embodiments, the power amplifier system further includes an input matching network connected between an input terminal and the driver stage, and the gain shaping current is configured to couple a portion of the radio frequency signal at the input terminal to a bias input of the driver stage.

In a number of embodiments, the power amplifier is a class E power amplifier.

In several embodiments, the gain shaping circuit is further configured to generate a reference current, and to bias the power amplifier based on the reference current. According to a number of embodiments, the gain shaping circuit is configured to adjust the reference current to account for process variation. In accordance with various embodiments, the gain shaping circuit is configured to adjust the reference current based on a frequency of the radio frequency signal. According to some embodiments, the gain shaping circuit is configured to generate the reference current with a temperature compensated slope. In accordance with a number of embodiments, the gain shaping circuit is configured to bias the power amplifier based on combining the reference current and the gain shaping current.

In some embodiments, the power amplifier system is implemented in user equipment of a cellular network.

In certain embodiments, the present disclosure relates to a method of amplification in a radio frequency communication system. The method includes amplifying a radio frequency signal using a power amplifier, controlling a voltage level of a supply voltage of the power amplifier based on an envelope of the radio frequency signal using an envelope tracker, and biasing the power amplifier based on a gain shaping current using a gain shaping circuit, including controlling the gain shaping current based on the voltage level of the supply voltage from the envelope tracker.

In a number of embodiments, the method further includes mapping a plurality of supply voltage levels of the supply voltage to a corresponding plurality of current levels of the gain shaping current.

In several embodiments, the method further includes providing a plurality of different gain expansions for a plurality of different voltage levels of the supply voltage.

In some embodiments, the method further includes reducing the gain shaping current in response to an increase in the voltage level of the supply voltage of the power amplifier.

In various embodiments, controlling the gain shaping current includes individually selecting one or more of a plurality of current steering circuits based on the voltage level of the supply voltage.

In some embodiments, biasing the power amplifier with the gain shaping current includes biasing at least one stage of the power amplifier. In accordance with a number of embodiments, the at least one stage includes a driver stage. According to several embodiments, the method further includes providing input matching using an input matching network that is coupled between an input terminal and the driver stage, and coupling a portion of the radio frequency signal at the input terminal to a bias input of the driver stage using the gain shaping circuit.

In various embodiments, the method further includes generating a reference current using the gain shaping circuit, and further biasing the power amplifier based on the reference current. According to several embodiments, the method further includes adjusting the reference current to account for process variation. In accordance with a number of embodiments, the method further includes adjusting the reference current based on a frequency of the radio frequency signal. According to some embodiments, the method further includes changing the reference current with a temperature compensated slope. In accordance with several embodiments, the method further includes combining the reference current and the gain shaping current.

In certain embodiments, the present disclosure relates to a mobile device. The mobile device includes a power management system including an envelope tracker configured to control a voltage level of a supply voltage based on an envelope of a radio frequency signal, a transceiver configured to generate the radio frequency signal, and a front end system including a power amplifier configured to amplify the radio frequency signal, and a gain shaping circuit configured to generate a gain shaping current based on the voltage level of the supply voltage from the envelope tracker, and to bias the power amplifier based on the gain shaping current.

In various embodiments, the gain shaping circuit is operable to map a plurality of supply voltage levels of the supply voltage to a corresponding plurality of current levels of the gain shaping current.

In several embodiments, the gain shaping circuit provides a plurality of different gain expansions for a plurality of different voltage levels of the supply voltage.

In some embodiments, the gain shaping circuit reduces the gain shaping current in response to an increase in the voltage level of the supply voltage of the power amplifier.

In various embodiments, the gain shaping circuit includes a plurality of current steering circuits each configured to control the gain shaping current based on a comparison relating to the voltage level of the supply voltage. According to a number of embodiments, the gain shaping circuit includes a regulator configured to generate a plurality of reference voltages of different voltage levels, and the plurality of current steering circuits are each configured to compare the supply voltage to a corresponding one of the plurality of reference voltages. In accordance with several embodiments, the mobile device further includes a regulator configured to generate a common reference voltage and a resistor ladder configured to receive the supply voltage and to generate a plurality of scaled supply voltages, and the plurality of current steering circuits are each configured to compare the common reference voltage to a corresponding one of the plurality of scaled supply voltages.

In several embodiments, the gain shaping circuit biases at least one stage of the power amplifier. According to a number of embodiments, the at least one stage includes a driver stage. In accordance with various embodiments, mobile device further includes an input matching network connected between an input terminal and the driver stage, and the gain shaping current is configured to couple a portion of the radio frequency signal at the input terminal to a bias input of the driver stage.

In some embodiments, the power amplifier is a class E power amplifier.

In various embodiments, the gain shaping circuit is further configured to generate a reference current, and to bias the power amplifier based on the reference current. According to a number of embodiments, the gain shaping circuit is configured to adjust the reference current to account for process variation. In accordance with several embodiments, the gain shaping circuit is configured to adjust the reference current based on a frequency of the radio frequency signal. According to a number of embodiments, the gain shaping circuit is configured to generate the reference current with a temperature compensated slope. In accordance with some embodiments, the gain shaping circuit is configured to bias the power amplifier based on combining the reference current and the gain shaping current.

In a number of embodiments, the mobile device further includes a battery operable to provide a battery voltage to the envelope tracker.

In several embodiments, the transceiver is further configured to provide the envelope tracker with an envelope signal indicating the envelope of the radio frequency signal.

In some embodiments, the power amplifier is configured to output an amplified radio frequency signal, and the mobile device further includes an antenna configured to wirelessly transmit the amplified radio frequency signal.

BRIEF DESCRIPTION OF THE DRAWINGS

Embodiments of this disclosure will now be described, by way of non-limiting example, with reference to the accompanying drawings.

FIG. 17A is one example of measurement results of gain versus output power for a class E power amplifier operating at various supply voltage levels.

FIG. 17B is another example of measurement results of gain versus output power for a class E power amplifier operating at various supply voltage levels.

DETAILED DESCRIPTION OF CERTAIN EMBODIMENTS

Figure 1:
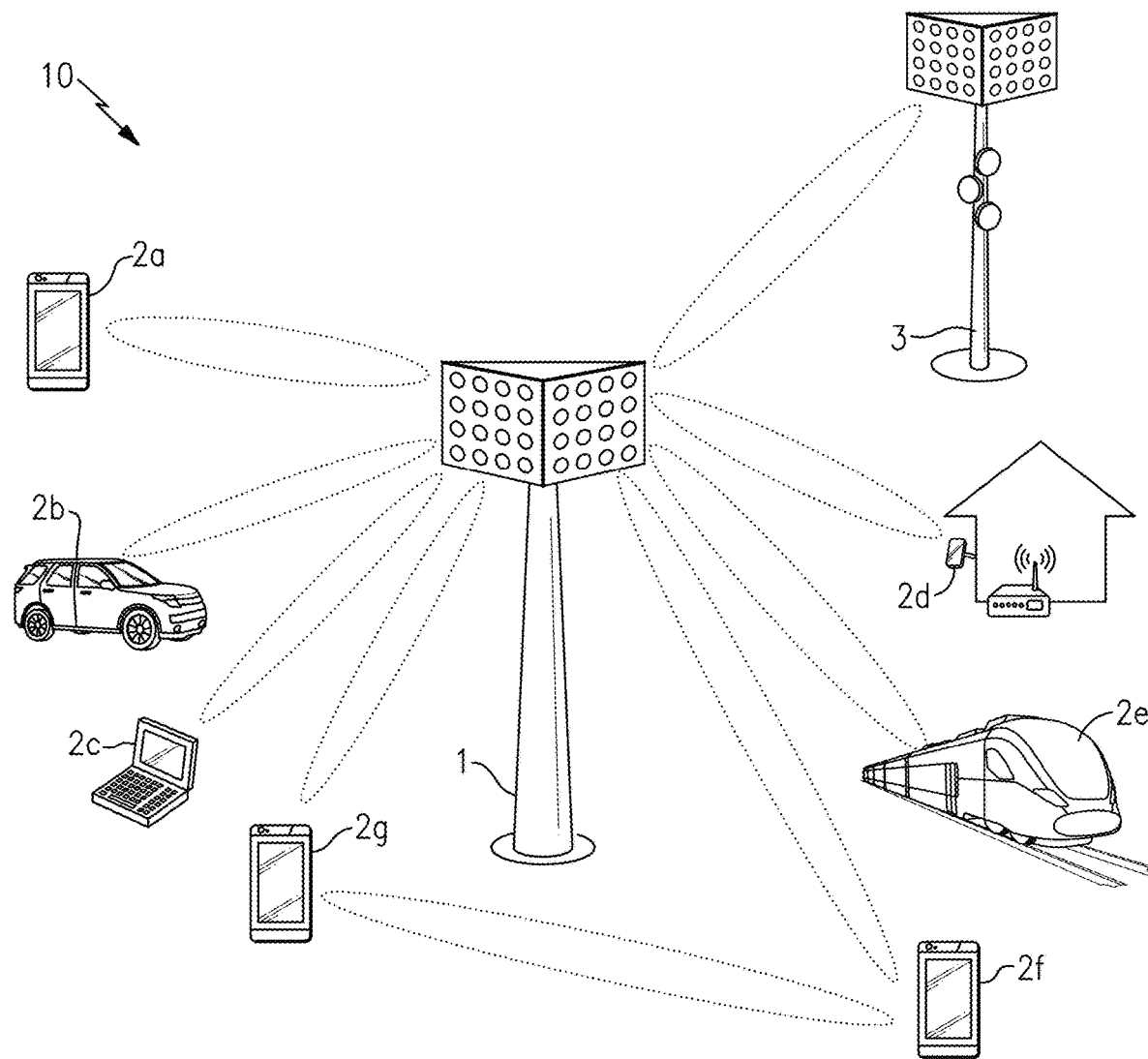
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2020). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Advanced Gain Shaping for Envelope Tracking Power Amplifiers

A power amplifier is used to amplify a radio frequency (RF) signal for transmission on an antenna of an RF communication system, such as a mobile device. To extend battery life and/or to reduce heat dissipation of the RF communication system, it is desirable for the power amplifier to operate with high efficiency.

One technique for improving efficiency of a power amplifier is envelope tracking (ET), in which a supply voltage ($V_{CC}$) of the power amplifier is controlled in relation to the envelope of the RF signal. Thus, when a voltage level of the envelope of the RF signal increases the voltage level of the power amplifier's supply voltage is increased. Likewise, when the voltage level of the envelope of the RF signal decreases the voltage level of the power amplifier's supply voltage is decreased to reduce power consumption.

Peak power added efficiency (PAE) of a power amplifier typically occurs relative close to saturated output power (Psat), which is a highly compressed operating point. For a power amplifier that operates with envelope tracking, the power amplifier operates at less than the 1 dB compression point when $V_{CC}$ is equal to a root mean square voltage ($V_{RMS}$). In one example, operation below the 1 dB compression point occurs frequently for an envelope tracking system using an isogain table to map an envelope signal to a shaped envelope signal so as to maintain a substantially constant gain across an envelope signal range. PAE of a power amplifier at such operating points is much lower than peak PAE.

To enhance PAE, the power amplifier can be biased such that gain expansion at $V_{RMS}$ is increased. However, providing gain expansion in this manner can degrade performance at low $V_{CC}$ levels and/or provide too much gain expansion at high $V_{CC}$ levels. This in turn can introduce undesirable memory effects, degrade linearity, and/or deteriorate receive band specifications, such as desense.

Although a gain boosting circuit can be included to adjust gain shape, a gain boosting circuit may also degrade linearity.

Advanced gain shaping for envelope tracking power amplifiers is disclosed herein. In certain implementations, an RF communication system includes a power amplifier that amplifies an RF signal and an envelope tracker that controls a voltage level of a supply voltage ($V_{CC}$) of the power amplifier based on an envelope of the RF signal. The RF communication system further includes a gain shaping circuit that generates a gain shaping current ($I_{ADS}$) that changes with the voltage level of the supply voltage from the envelope tracker. For example, the gain shaping circuit can include an analog look-up table (LUT) mapping a particular voltage level of $V_{CC}$ to a particular current level of $I_{ADS}$. Additionally, the gain shaping circuit biases the power amplifier based on the gain shaping current.

By implementing the RF communication system in this manner, flexibility is provided for adjusting gain expansion at different levels of $V_{CC}$. For example, when $V_{CC}$ is about equal to $V_{RMS}$, sharper gain compression and higher gain expansion can be provided. Additionally, when $V_{CC}$ is equal to a minimum or lowest supply voltage ($V_{LOW}$), a flat landing zone with low gain distortion (AM/AM) can be provided. Furthermore, when $V_{CC}$ is equal to a maximum or highest supply voltage ($V_{HIGH}$), low gain expansion can be provided.

By providing different combinations of gain profiles for different voltage levels of $V_{CC}$, PAE of a power amplifier can be enhanced, for instance, by 2% or more. Furthermore, such PAE enhancement can be provided while maintaining linearity performance. Thus, advanced gain shaping can be used to achieve both good PAE and linearity. In contrast, other approaches suffer from undesirable tradeoffs between efficiency and linearity.

In certain implementations, the gain shaping circuit includes a current controller implemented on a semiconductor chip, such as a silicon (Si) chip. Additionally, the current controller generates $I_{ADS}$ to change based on frequency band, for instance, to cover any suitable frequency range, including, but not limited to, 450 MHz to 7 GHz, or more particularly, 650 MHz to 915 MHz.

In certain implementations, the bias to the power amplifier is generated based on both $I_{ADS}$ and a reference current ($I_{REF}$). Generating the power amplifier's bias in this manner provides a number of advantages. In a first example, $I_{REF}$ is adjustable (for instance, can be trimmed or otherwise adjusted after manufacture) to reduce process variation. Thus, advanced gain shaping can be implemented to reduce or eliminate process variation, thereby providing precise control of bias current. In a second example, $I_{REF}$ is adjustable for different frequency bands to cover high fractional bandwidth (for instance, 31.9% or more). In a third example, $I_{REF}$ versus $V_{CC}$ LUT is created, thereby defining gain shaping at each $V_{CC}$ level and providing a fast response time. In a fourth example, $I_{REF}$ provides flexibility to change the gain expansion, for instance, to fine tune the gain shape. In a fifth example, $I_{REF}$ is implemented with a temperature compensation slope, thereby compensating gain variation due to temperature.

The power amplifier can be biased based on $I_{ADS}$ in any suitable way. In one example, one or more stages of a power amplifier (including, but not limited to, a driver stage and/or output stage) is biased based on $I_{ADS}$.

Figure 2:
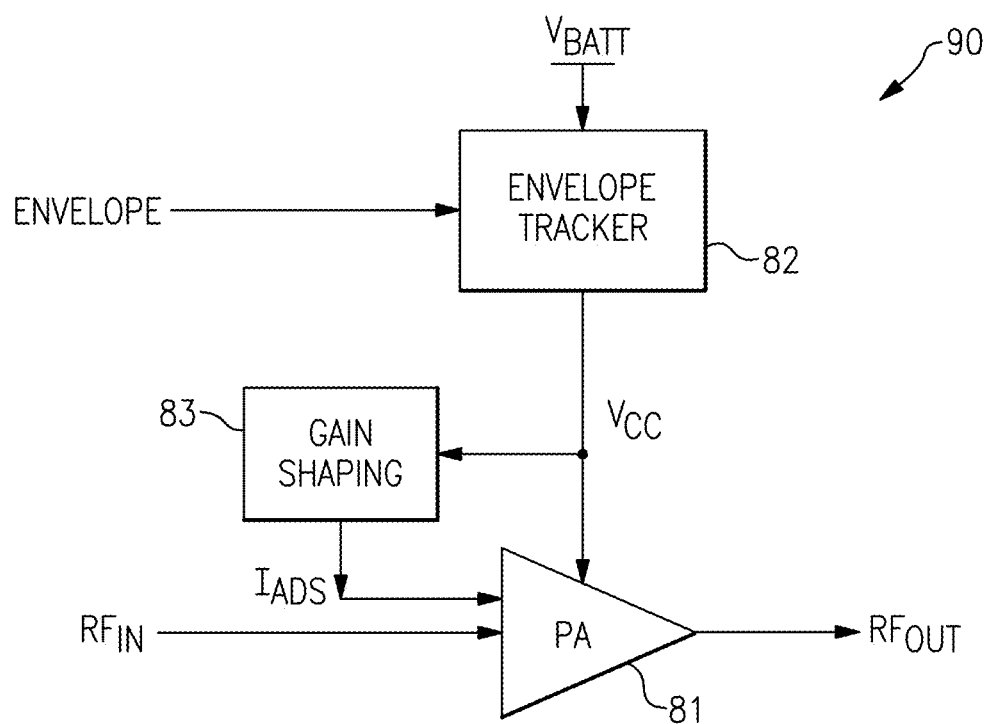
FIG. 2 is a schematic diagram of a power amplifier system with advanced gain shaping according to one embodiment.

FIG. 2 is a schematic diagram of a power amplifier system 90 with advanced gain shaping according to one embodiment. The power amplifier system 90 includes a power amplifier 81, an envelope tracker 82, and a gain shaping circuit 83 implemented to provide advanced gain shaping in accordance with the teachings herein.

In the illustrated embodiment, the power amplifier 81 amplifies an RF input signal $RF_{IN}$ to generate an RF output signal $RF_{OUT}$. The power amplifier 81 receives power from a supply voltage $V_{CC}$ that is controlled by the envelope tracker 82.

The envelope tracker 82 receives an envelope signal ENVELOPE corresponding to an envelope of the RF input signal $RF_{IN}$ amplified by the power amplifier 81. The envelope tracker 82 is powered by a battery voltage $V_{BATT}$, and controls the voltage level of the supply voltage $V_{CC}$ based on the envelope signal ENVELOPE.

The gain shaping circuit 83 biases the power amplifier 81 based on a gain shaping current $I_{ADS}$ that changes based on the voltage level of the supply voltage $V_{CC}$ from the envelope tracker 82. For example, the gain shaping circuit 83 can include an analog look-up table (LUT) mapping a particular voltage level of $V_{CC}$ to a particular current level of $I_{ADS}$.

By implementing the RF communication system 90 in this manner, flexibility is provided for adjusting gain expansion at different levels of $V_{CC}$. By providing different combinations of gain profiles for different voltage levels of $V_{CC}$, PAE of the power amplifier 81 can be enhanced, for instance, by 2% or more. Furthermore, such PAE enhancement can be provided while maintaining linearity performance. Thus, advanced gain shaping can be used to achieve both good PAE and linearity.

In the illustrated embodiment, the gain shaping current $I_{ADS}$ is provided to a bias input of the power amplifier 81. In certain implementations, the gain shaping circuit 83 includes a current controller that generates the gain shaping current $I_{ADS}$, and a power amplifier biasing circuit that processes the gain shaping current $I_{ADS}$ to control the bias of the power amplifier 81. In one example, the power amplifier biasing circuit combines the gain shaping current $I_{ADS}$ with a reference current from the current controller to generate the bias of the power amplifier 81.

Figure 3:
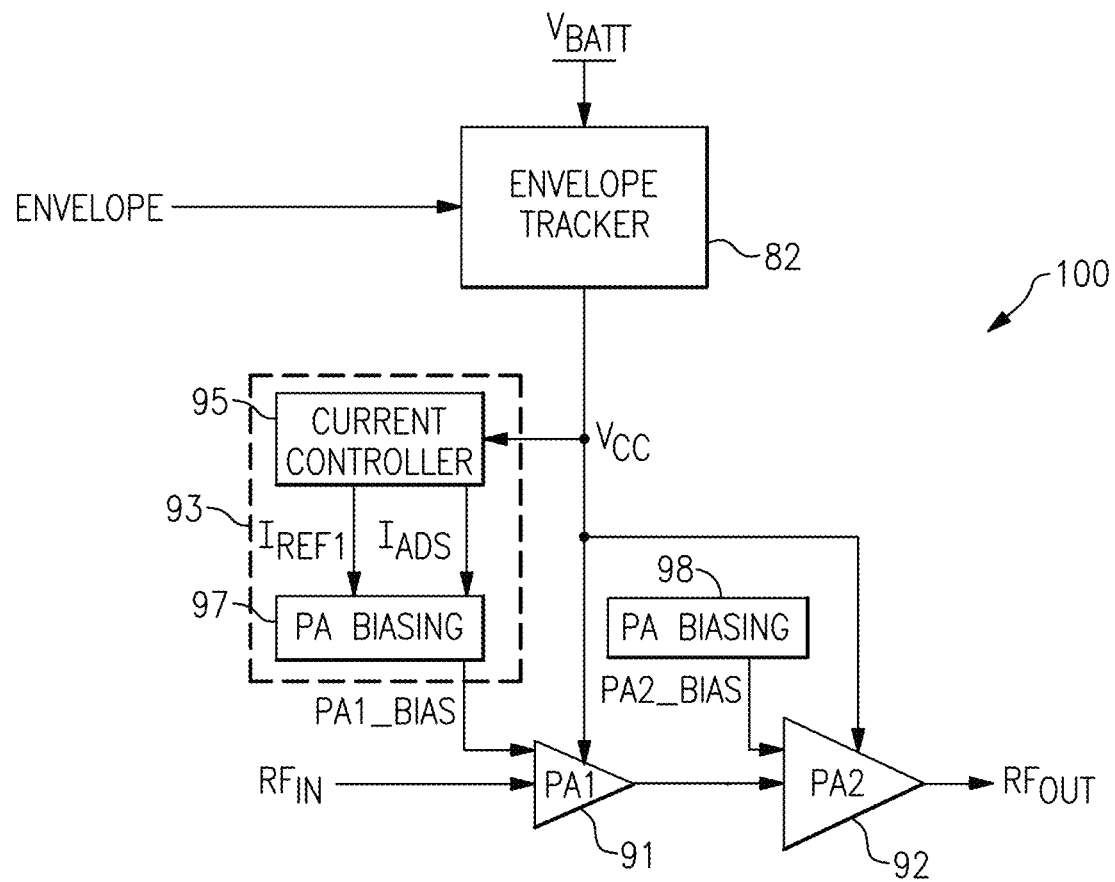
FIG. 3 is a schematic diagram of a power amplifier system with advanced gain shaping according to another embodiment.

FIG. 3 is a schematic diagram of a power amplifier system 100 with advanced gain shaping according to another embodiment. The power amplifier system 100 includes an envelope tracker 82, a first power amplifier stage 91, a second power amplifier stage 92, and a gain shaping circuit 93 implemented to provide advanced gain shaping in accordance with the teachings herein. The gain shaping circuit 93 includes a current controller 95 and a first power amplifier biasing circuit 97 that generates a first bias PA1_BIAS for the first power amplifier stage 91. As shown in FIG. 3, the power amplifier system 100 further includes a second power amplifier biasing circuit 98 that generates a second bias PA2_BIAS for the second power amplifier stage 92.

In the illustrated embodiment, the current controller 95 receives the power amplifier supply voltage $V_{CC}$ from the envelope tracker 82, and generates a reference current $I_{REF1}$ and a gain shaping current $I_{ADS}$. Additionally, the first power amplifier biasing circuit 97 generates a first bias PA1_BIAS of the first power amplifier stage 91 based on the reference current $I_{REF1}$ and the gain shaping current $I_{ADS}$. In certain implementations, the first power amplifier biasing circuit 97 combines the reference current $I_{REF1}$ and the gain shaping current $I_{ADS}$ to generate the first bias PA1_BIAS.

In certain implementations, the current controller 95 is fabricated on a first semiconductor chip (for instance, a Si chip), while the first power amplifier biasing circuit 97, the second power amplifier biasing circuit 98, the first power amplifier stage 91, and the second power amplifier stage 92 are fabricated on a second semiconductor chip (for instance, a compound semiconductor chip, such as a GaAs or GaN chip).

Figure 4:
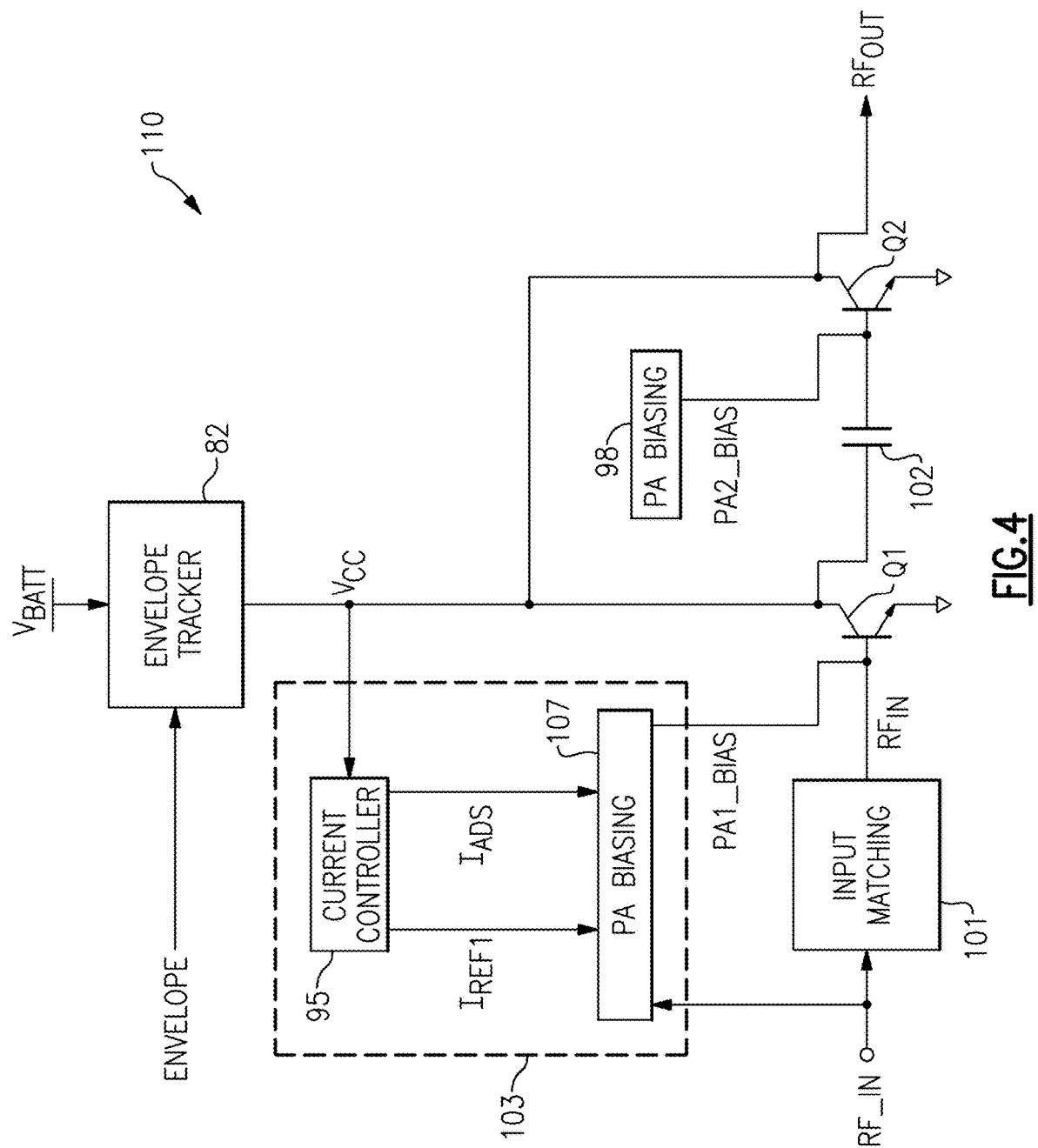
FIG. 4 is a schematic diagram of a power amplifier system with advanced gain shaping according to another embodiment.

FIG. 4 is a schematic diagram of a power amplifier system 110 with advanced gain shaping according to another embodiment. The power amplifier system 110 includes an envelope tracker 82, a first stage bipolar transistor Q1, a second stage bipolar transistor Q2, an input matching network 101, an interstage capacitor 102, and a gain shaping circuit 103 implemented to provide advanced gain shaping in accordance with the teachings herein. The gain shaping circuit 103 includes a current controller 95 and a first power amplifier biasing circuit 107 that generates a first bias PA1_BIAS for the first stage bipolar transistor Q1. As shown in FIG. 4, the power amplifier system 110 further includes a second power amplifier biasing circuit 98 that generates a second bias PA2_BIAS for the second stage bipolar transistor Q2.

The gain shaping circuit 103 of FIG. 4 is similar to the gain shaping circuit 93 of FIG. 3, except that the gain shaping circuit 103 of FIG. 4 is also coupled to an RF input terminal RF_IN connected to an input to the input matching network 101. Additionally, the gain shaping circuit 103 provides the first bias PA1_BIAS to a base of the input stage bipolar transistor Q1 at a node that is connected to an output of the input matching network 101.

With continuing reference to FIG. 4, the first power amplifier biasing circuit 107 receives an RF input signal at the RF input terminal RF_IN, and uses the RF input signal to modulate the base of the input stage bipolar transistor Q1. Thus, the input stage bipolar transistor Q1 is also biased based on the RF input signal using a feedforward path, in this embodiment. In particular a base bias voltage of the input stage bipolar transistor Q1 is raised when the RF signal level increases, and lowered when the RF signal level decreases.

Figure 5A:
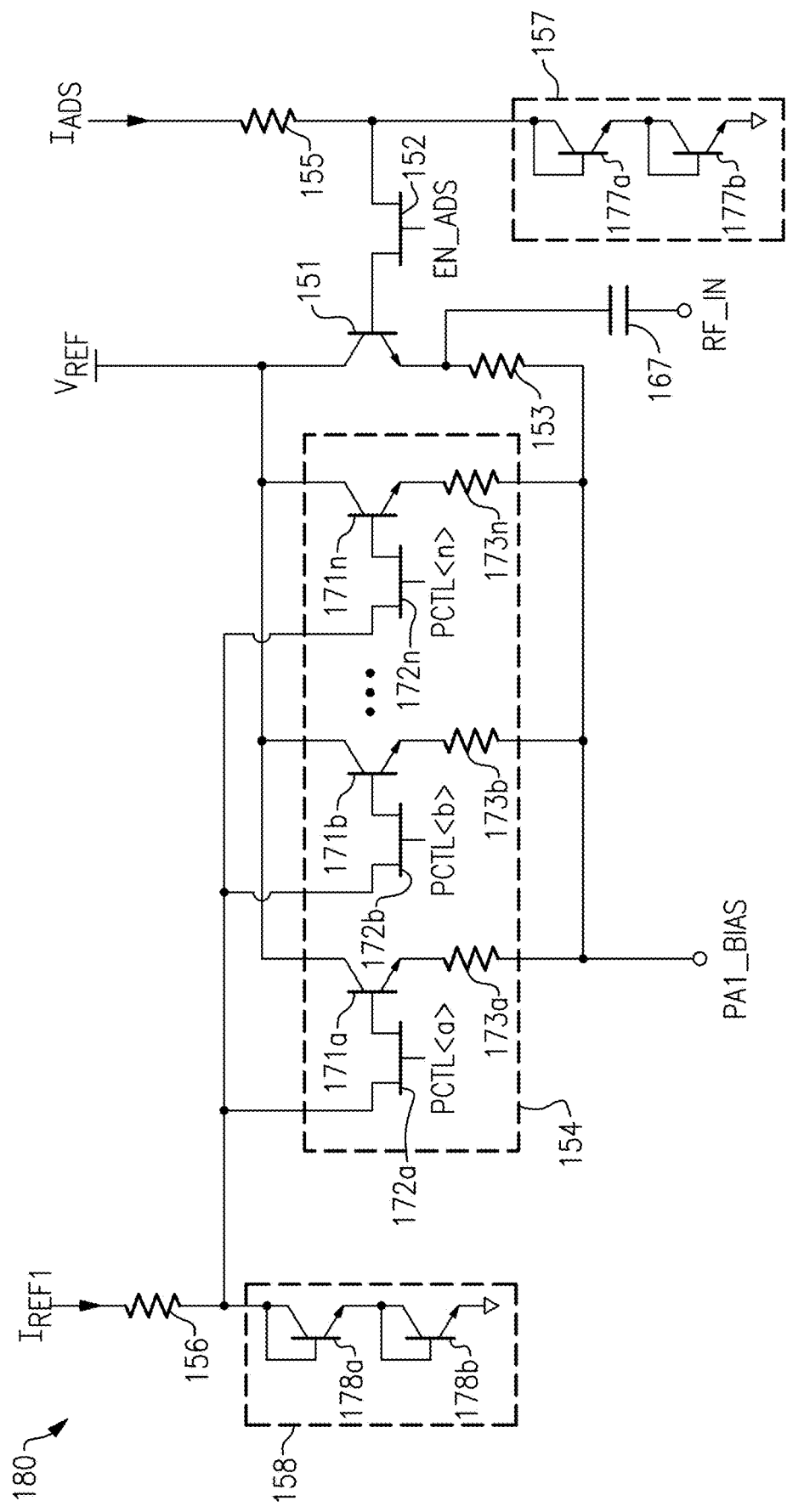
FIG. 5A is a schematic diagram of one embodiment of a power amplifier biasing circuit with advanced gain shaping.

FIG. 5A is a schematic diagram of one embodiment of a power amplifier biasing circuit 180 with advanced gain shaping. The power amplifier biasing circuit 180 illustrates one embodiment of the first power amplifier biasing circuit 107 of FIG. 4. Although one embodiment of a power amplifier biasing circuit is shown, the teachings herein are applicable to power amplifier biasing circuits implemented in a wide variety of ways. Accordingly, other implementations are possible.

In the illustrated embodiment, the power amplifier biasing circuit 180 includes a gain shaping bipolar transistor 151, a gain shaping enable FET 152, a gain shaping biasing resistor 153, a power control circuit 154, a gain shaping current resistor 155, a reference current resistor 156, a gain shaping current load 157, a reference current load 158, and a signal feed capacitor 167.

As shown in FIG. 5A, the power control circuit 154 includes power control FETs 172a, 172b, . . . 172n that receive power control signals PCTL<a>, PCTL<b>, . . . PCTL<n>, respectively. Additionally, the power control circuit 154 further includes power control bipolar transistors 171a, 171b, . . . 171n and power control resistors 173a, 173b, . . . 173n.

The power amplifier biasing circuit 180 receives a gain shaping current $I_{ADS}$ that changes with the voltage level of the supply voltage from an envelope tracker. For example, the gain shaping current $I_{ADS}$ can be generated by a current controller that includes a LUT mapping a voltage level of the supply voltage to the gain shaping current $I_{ADS}$. The power amplifier biasing circuit 180 also receives a reference current $I_{REF1}$, which can also be generated by the current controller.

As shown in FIG. 5A, the gain shaping current load 157 includes a first diode-connected bipolar transistor 177a and a second diode-connected bipolar transistor 177b electrically connected in series and with one another and biased by the gain shaping current $I_{ADS}$. Additionally, the reference current load 158 includes a first diode-connected bipolar transistor 178a and a second diode-connected bipolar transistor 178b electrically connected in series and with one another and biased by the reference current $I_{REF1}$.

The gate of the gain shaping enable FET 152 is controlled by an enable signal EN_ADS for selectively enabling gain shaping. When the gain shaping enable FET 152 is enabled, the gain shaping bipolar transistor 151 is biased such that the current through the gain shaping bipolar transistor 151 changes in relation to the gain shaping current $I_{ADS}$. As shown in FIG. 5A, the gain shaping bipolar transistor 151 and the gain shaping biasing resistor 153 are connected in series between the reference voltage $V_{REF}$ and the power amplifier bias PA1_BIAS.

With continuing reference to FIG. 5A, the power control signals PCTL<a>, PCTL<b>, . . . PCTL<n> can be used to selectively enable one or more of the power control FETs 172a, 172b, . . . 172n. When a particular FET is enabled, the base of a corresponding one of the power control bipolar transistors 171a, 171b, . . . 171n is biased such that the current through the transistor changes in relation to the reference current $I_{REF1}$. As shown in FIG. 5A, each of the power control bipolar transistors 171a, 171b, . . . 171n are connected in series with a corresponding one of the power control resistors 173a, 173b, . . . 173n to form a group of series transistor/resistor circuit branches. Additionally, the series transistor/resistor branches are connected in parallel with one another between the reference voltage $V_{REF}$ and the power amplifier bias PA1_BIAS.

Thus, the current provided at the power amplifier bias PA1_BIAS can be controlled based on the gain shaping current $I_{ADS}$ and the reference current $I_{REF1}$. Furthermore, the power control signals PCTL<a>, PCTL<b>, . . . PCTL<n> can be used to scale the component of the power amplifier bias PA1_BIAS that changes based on the reference current $I_{REF1}$.

In the illustrated embodiment, the RF input terminal RF_IN is coupled to the power amplifier bias terminal PA1_BIAS through the signal feed capacitor 167 and the gain shaping biasing resistor 153. Thus, a path is provided for coupling a portion of the RF signal present at the RF input terminal RF_IN to the power amplifier bias PA1_BIAS.

Figure 5B:
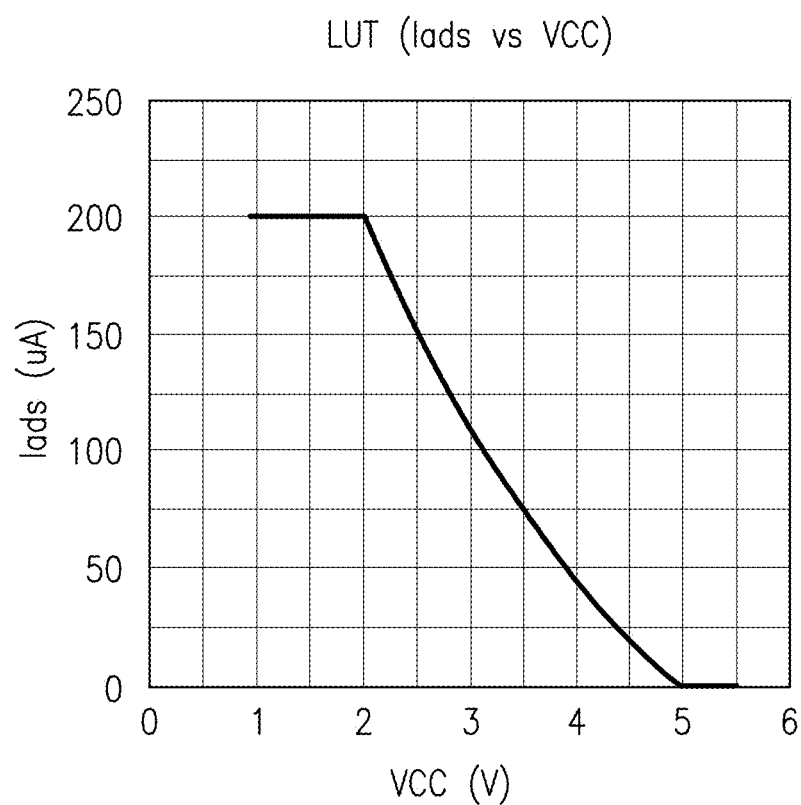
FIG. 5B is a graph of gain shaping current versus supply voltage for one implementation of the power amplifier biasing circuit of FIG. 5A.

FIG. 5B is a graph of gain shaping current versus supply voltage for one implementation of the power amplifier biasing circuit 180 of FIG. 5A. The graph illustrates one implementation of an $I_{ADS}$ versus $V_{CC}$ profile for a gain shaping circuit implemented in accordance with the teachings herein. Although one example $I_{ADS}$ versus $V_{CC}$ profile is shown, other implementations are possible.

In the example of FIG. 5B, the gain shaping current $I_{ADS}$ is adjusted from 0 uA to 200 uA based on a Q1 gain table. Additionally, power amplifier bias PA1_BIAS is controlled based on the gain shaping current $I_{ADS}$ and the reference current $I_{REF1}$, which is maintained turned ON while the gain shaping circuit is powered and enabled.

Implementing the gain shaping circuit in this manner provides a number of advantages, including, but not limited to, flatter landing zone, less gain expansion at high $V_{CC}$, and/or flexibility for adjusting gain shape for different $V_{CC}$. Furthermore, widening a dynamic range of $V_{CC}$ LUT permits a more aggressive gain shaping over $V_{CC}$.

Figure 6A:
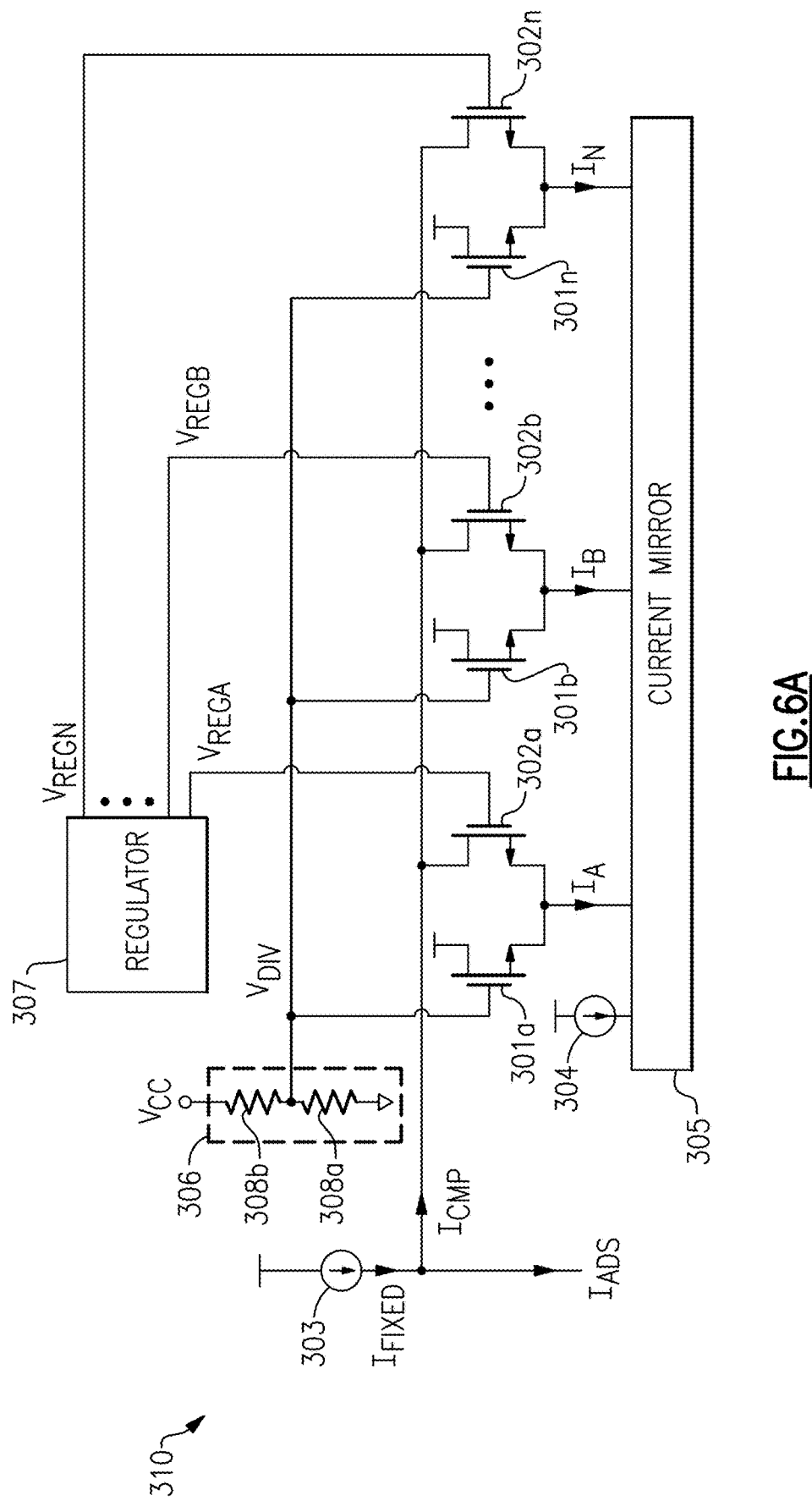
FIG. 6A is a schematic diagram of a current controller according to one embodiment.

FIG. 6A is a schematic diagram of a current controller 310 according to one embodiment. The current controller 310 includes first comparison FETs 301a, 301b, . . . 301n, second comparison FETs 302a, 302b, . . . 302n, a first current source 303, a second current source 304, a current mirror 305, a voltage divider 306, and a regulator 307. Although one embodiment of a current controller is shown, the teachings herein are applicable to current controllers implemented in a wide variety of ways.

The current controller 310 is used to generate a gain shaping current $I_{ADS}$ for a power amplifier biasing circuit that changes in relation to a voltage level of a supply voltage $V_{CC}$ from an envelope tracker. Although not shown in FIG. 6A, the current controller 310 can also include a current source for generating a reference current $I_{REF1}$ for the power amplifier biasing circuit.

In the illustrated embodiment, the voltage divider 306 includes a first resistor 308a and a second resistor 308b that are connected as a voltage divider. Thus, the voltage divider 306 generates a divided voltage $V_{DIV}$ (for instance, half the supply voltage from the envelope tracker, or $V_{CC}/2$).

As shown in FIG. 6A, the divided voltage $V_{DIV}$ is provided to each of the first comparison FETs 301a, 301b, . . . 301n. Additionally, the regulator 307 generates multiple regulated voltages $V_{REGA}$, $V_{REGB}$, . . . $V_{REGN}$ of different voltage levels. Furthermore, the regulated voltages $V_{REGA}$, $V_{REGB}$, . . . $V_{REGN}$ are provided to the second comparison FETs 302a, 302b, . . . 302n, respectively.

The illustrated comparison FETs operate as a current steering circuit that steers a comparison current $I_{CMP}$ away from the fixed current $I_{FIXED}$ generated by the first current source 303.

Thus, the amount of current sinking in $I_{ADS}$ is reduced when $V_{CC}$ increases. For example, as $V_{CC}$ increases (for instance, half of $V_{CC}$ is larger than the reference to be compared with), current steps $I_A$, $I_B$, . . . $I_N$ are taken in sequence.

In one example, $I_{FIXED}$ is 200 μA and six equally sized current comparators are provided, such that about 33 μA is taken from the 200 μA as each comparator is activated in sequence. When $V_{CC}$ reaches a top of the voltage operating range (for instance 5V), all the taps will be active and steering their currents from the fixed 200 μA, thereby controlling $I_{ADS}$ to about 0 μA. Although one example of current steering thresholds and values has been described, the teachings herein are applicable to gain shaping circuits implemented in a wide variety of ways. Accordingly, other implementations are possible.

Figure 6B:
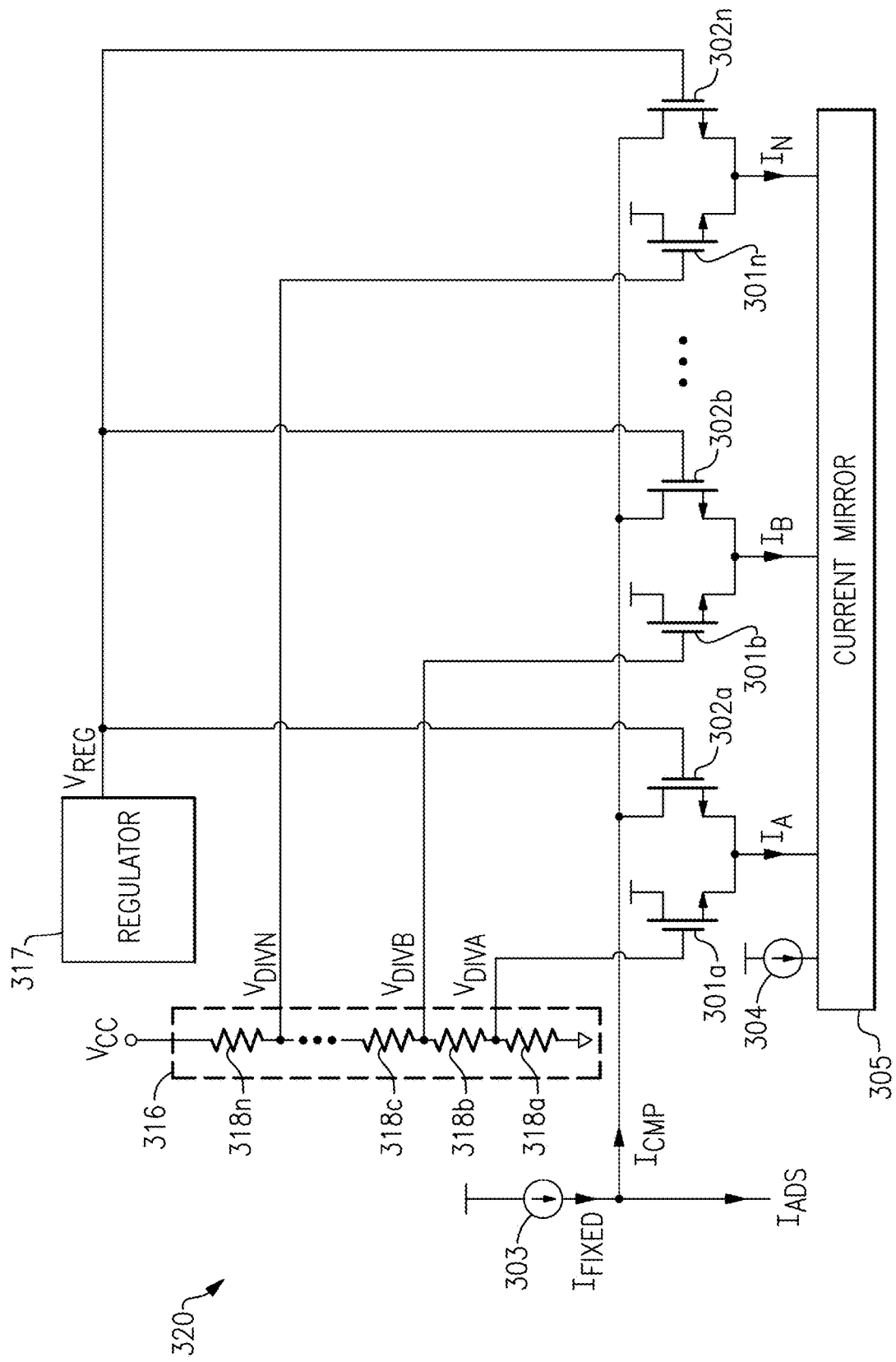
FIG. 6B is a schematic diagram of a current controller according to another embodiment.

FIG. 6B is a schematic diagram of a current controller 320 according to another embodiment. The current controller 320 includes first comparison FETs 301a, 301b, . . . 301n, second comparison FETs 302a, 302b, . . . 302n, a first current source 303, a second current source 304, a current mirror 305, a voltage divider 316, and a regulator 317. Although one embodiment of a current controller is shown, the teachings herein are applicable to current controllers implemented in a wide variety of ways.

In comparison to the current controller 310 of FIG. 3A that uses multiple regulated voltages $V_{REGA}$, $V_{REGB}$, . . . $V_{REGN}$ for current comparisons, the current controller 320 of FIG. 6B uses a common or shared regulated voltage $V_{REG}$ for comparisons. For example, a bandgap voltage can be used directly as a reference voltage for each of the taps of the current steering circuits. Additionally, the voltage divider 316 is implemented to generate different ratios of $V_{CC}$ that are compared to the regulated voltage $V_{REG}$.

As shown in FIG. 6B, the voltage divider 316 includes a stack of resistors 318a, 318b, 318c, . . . 318n.

In certain implementations, the topmost resistor in the stack of resistors has a resistance R_upper, the lowermost resistor in the stack of resistors has a resistance R_lower, and the resistors between the topmost resistor and the lowermost resistor have a resistance R_inner. For example, in a case with a stack of 8 resistors, the topmost resistor can have a resistance R_upper, the lowermost resistor can have a resistance R_lower, and the six inner resistors can have a resistance R_inner. Additionally, R_upper and R_lower are used to adjust a range desired for voltage sensing and comparison (for instance, $2V<V_{CC}<5V$).

In one implementation, a total resistance is 205 kΩ (R_inner=7.5 kΩ, R_upper=105 kΩ, and R_lower=52.5 kΩ), with a unit resistor size of (W×L=1 μm×6.6 μm) and a current consumption of about 24 μA for $V_{CC}$ of about 5 V. However, other implementations are possible.

Figure 7:
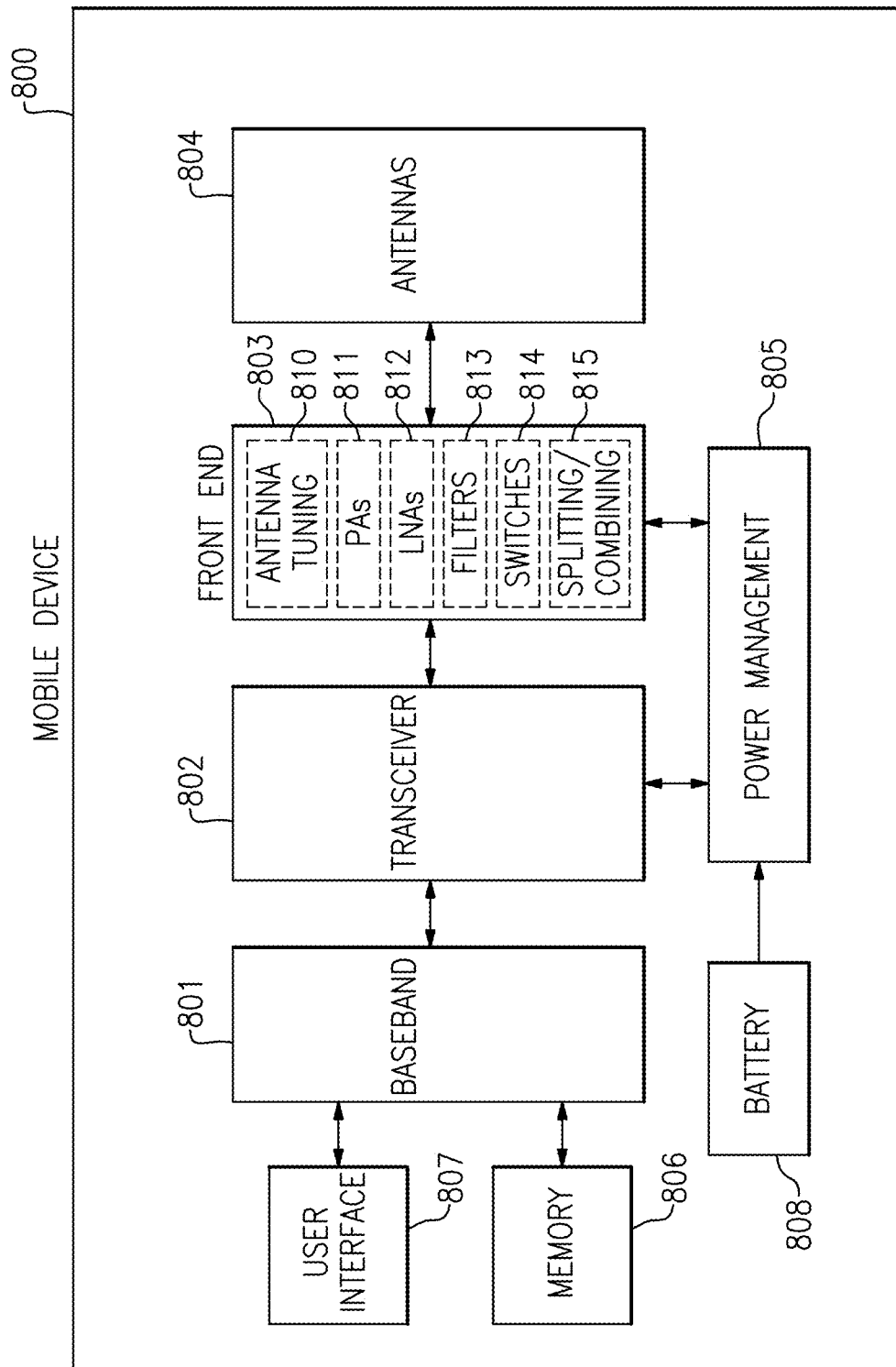
FIG. 7 is a schematic diagram of one embodiment of a mobile device.

FIG. 7 is a schematic diagram of one embodiment of a mobile device 800. The mobile device 800 includes a baseband system 801, a transceiver 802, a front end system 803, antennas 804, a power management system 805, a memory 806, a user interface 807, and a battery 808. The mobile device 800 can be implemented in accordance with any of the embodiments herein.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 7, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 7, the power management system 805 receives a battery voltage from the battery 808. The battery 808 can be any suitable battery for use in the mobile device 800, including, for example, a lithium-ion battery.

Figure 8:
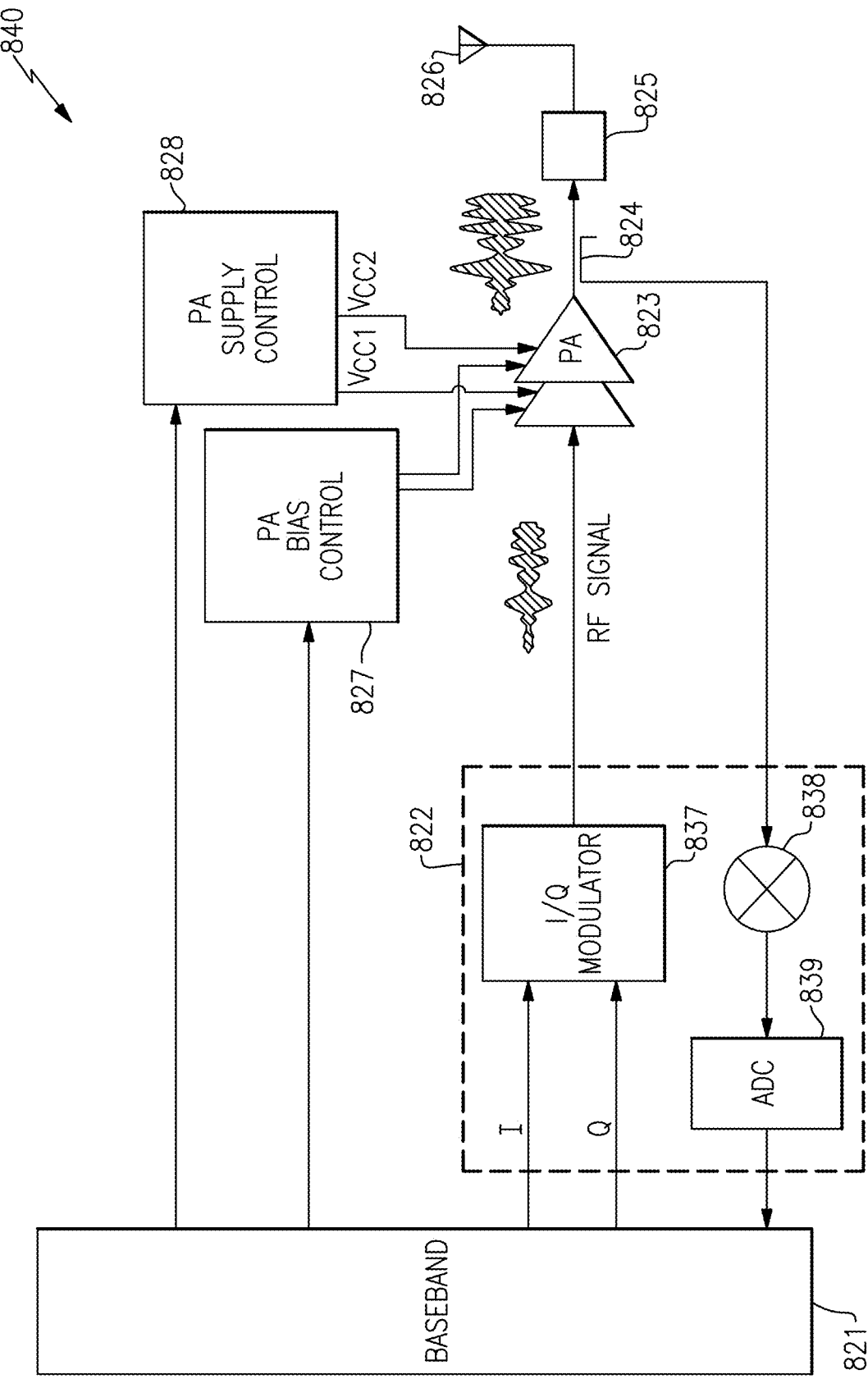
FIG. 8 is a schematic diagram of a power amplifier system according to one embodiment.

FIG. 8 is a schematic diagram of a power amplifier system 840 according to one embodiment. The illustrated power amplifier system 840 includes a baseband processor 821, a transmitter 822, a power amplifier (PA) 823, a directional coupler 824, front-end circuitry 825, an antenna 826, a PA bias control circuit 827, and a PA supply control circuit 828. The illustrated transmitter 822 includes an I/Q modulator 837, a mixer 838, and an analog-to-digital converter (ADC) 839. In certain implementations, the transmitter 822 is included in a transceiver such that both transmit and receive functionality is provided. The power amplifier system 840 can be implemented in accordance with any of the embodiments herein.

The baseband processor 821 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 837 in a digital format. The baseband processor 821 can be any suitable processor configured to process a baseband signal. For instance, the baseband processor 821 can include a digital signal processor, a microprocessor, a programmable core, or any combination thereof. Moreover, in some implementations, two or more baseband processors 821 can be included in the power amplifier system 840.

The I/Q modulator 837 can be configured to receive the I and Q signals from the baseband processor 821 and to process the I and Q signals to generate an RF signal. For example, the I/Q modulator 837 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 823. In certain implementations, the I/Q modulator 837 can include one or more filters configured to filter frequency content of signals processed therein.

The power amplifier 823 can receive the RF signal from the I/Q modulator 837, and when enabled can provide an amplified RF signal to the antenna 826 via the front-end circuitry 825.

The front-end circuitry 825 can be implemented in a wide variety of ways. In one example, the front-end circuitry 825 includes one or more switches, filters, duplexers, multiplexers, and/or other components. In another example, the front-end circuitry 825 is omitted in favor of the power amplifier 823 providing the amplified RF signal directly to the antenna 826.

The directional coupler 824 senses an output signal of the power amplifier 823. Additionally, the sensed output signal from the directional coupler 824 is provided to the mixer 838, which multiplies the sensed output signal by a reference signal of a controlled frequency. The mixer 838 operates to generate a downshifted signal by downshifting the sensed output signal's frequency content. The downshifted signal can be provided to the ADC 839, which can convert the downshifted signal to a digital format suitable for processing by the baseband processor 821. Including a feedback path from the output of the power amplifier 823 to the baseband processor 821 can provide a number of advantages. For example, implementing the baseband processor 821 in this manner can aid in providing power control, compensating for transmitter impairments, and/or in performing digital pre-distortion (DPD). Although one example of a sensing path for a power amplifier is shown, other implementations are possible.

The PA supply control circuit 828 receives a power control signal from the baseband processor 821, and controls supply voltages of the power amplifier 823. In the illustrated configuration, the PA supply control circuit 828 generates a first supply voltage $V_{CC1}$ for powering an input stage of the power amplifier 823 and a second supply voltage $V_{CC2}$ for powering an output stage of the power amplifier 823. The PA supply control circuit 828 can control the voltage level of the first supply voltage $V_{CC1}$ and/or the second supply voltage $V_{CC2}$ to enhance the power amplifier system's PAE.

The PA supply control circuit 828 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 828 is a multi-mode supply control circuit that can operate in multiple supply control modes including an APT mode and an ET mode. For example, the power control signal from the baseband processor 821 can instruct the PA supply control circuit 828 to operate in a particular supply control mode.

As shown in FIG. 8, the PA bias control circuit 827 receives a bias control signal from the baseband processor 821, and generates bias control signals for the power amplifier 823. In the illustrated configuration, the bias control circuit 827 generates bias control signals for both an input stage of the power amplifier 823 and an output stage of the power amplifier 823. However, other implementations are possible.

Figure 9A:
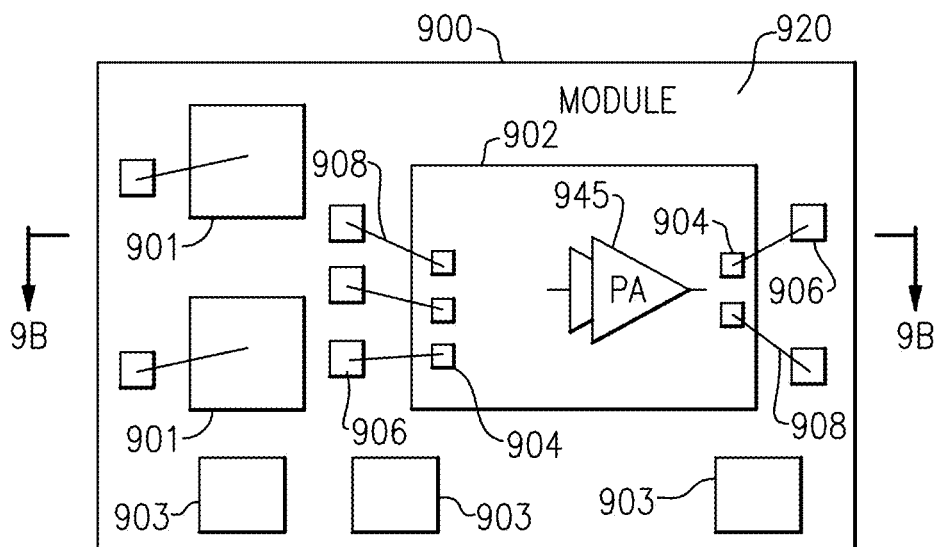
FIG. 9A is a schematic diagram of one embodiment of a packaged module.
Figure 9B:
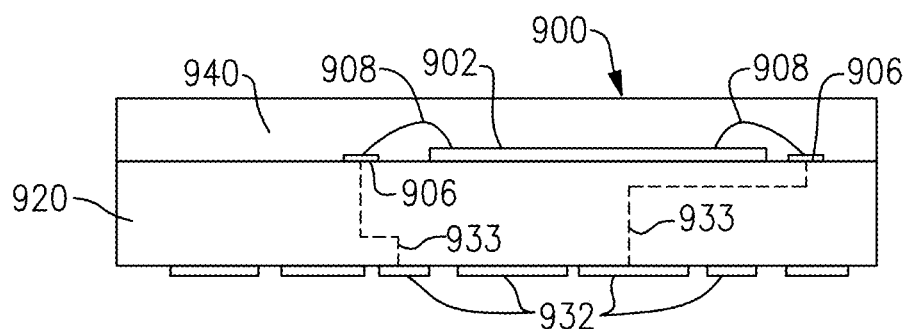
FIG. 9B is a schematic diagram of a cross-section of the packaged module of FIG. 9A taken along the lines 9B-9B.

FIG. 9A is a schematic diagram of one embodiment of a packaged module 900. FIG. 9B is a schematic diagram of a cross-section of the packaged module 900 of FIG. 9A taken along the lines 9B-9B. The packaged module 900 can be implemented in accordance with any of the embodiments herein.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a power amplifier 945, which can be implemented in accordance with one or more features disclosed herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 9B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 9B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Figure 10A:
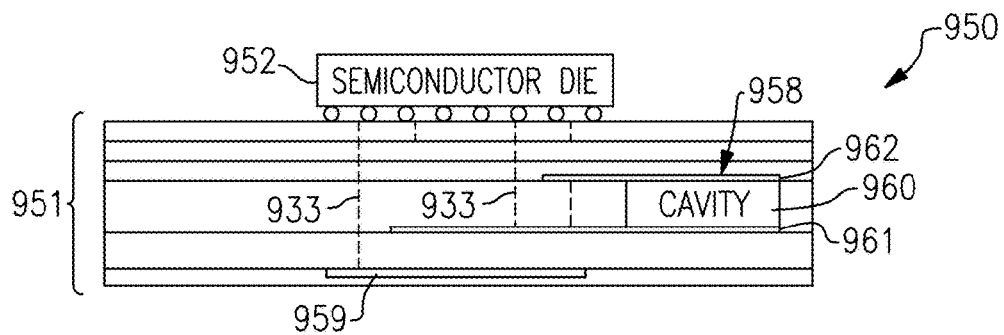
FIG. 10A is a schematic diagram of a cross-section of another embodiment of a packaged module.

FIG. 10A is a schematic diagram of a cross-section of another embodiment of a packaged module 950. The packaged module 950 includes a laminated package substrate 951 and a flip-chip die 952. The packaged module 950 can be implemented in accordance with any of the embodiments herein.

The laminated package substrate 951 includes a cavity-based antenna 958 associated with an air cavity 960, a first conductor 961, a second conductor 962. The laminated package substrate 951 further includes a planar antenna 959.

In certain implementations herein, a packaged module includes one or more integrated antennas. For example, the packaged module 950 of FIG. 10A includes the cavity-based antenna 958 and the planar antenna 959. By including antennas facing in multiple directions (including, but not limited to, directions that are substantially perpendicular to one another), a range of available angles for communications can be increased. Although one example of a packaged module with integrated antennas is shown, the teachings herein are applicable to modules implemented in a wide variety of ways.

Figure 10B:
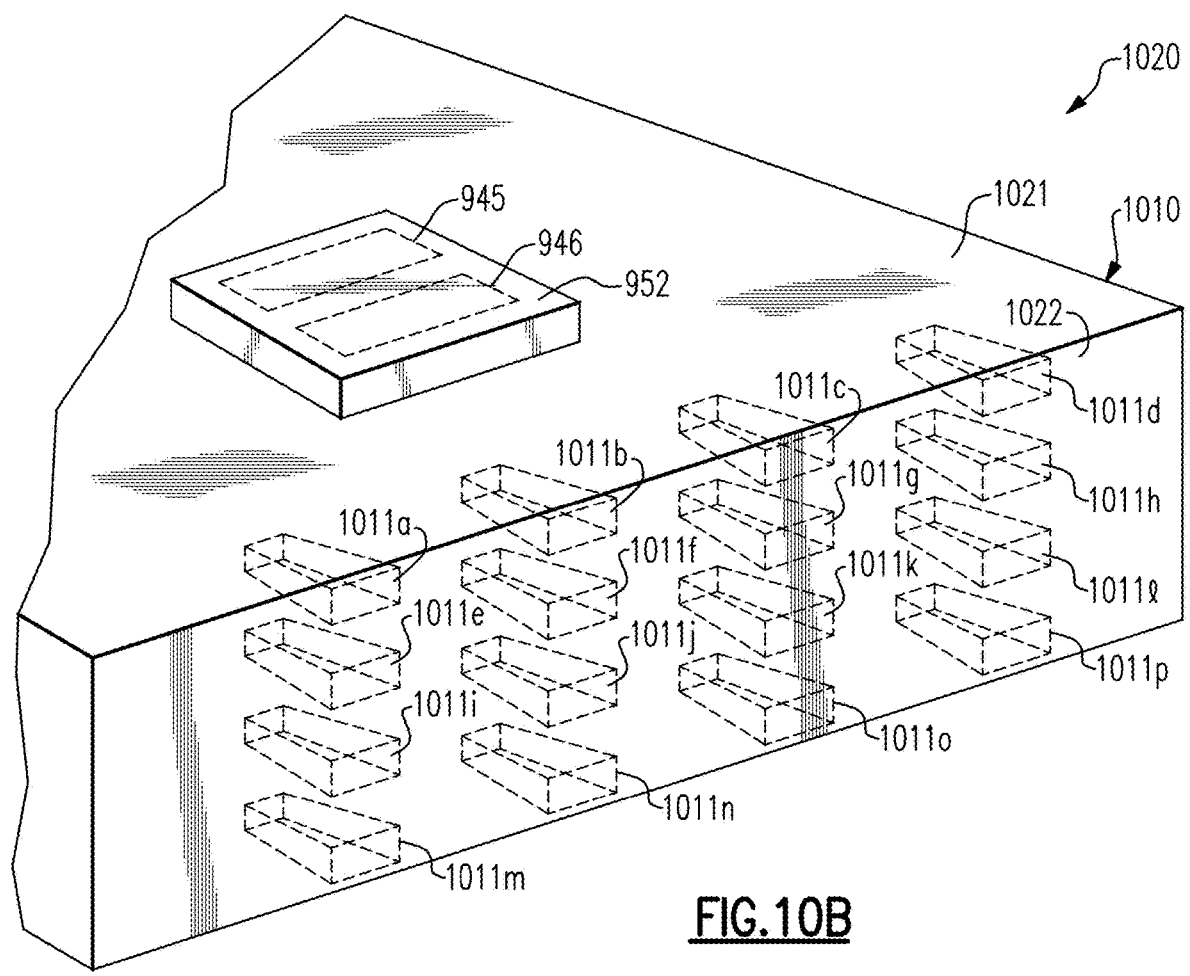
FIG. 10B is a perspective view of another embodiment of a packaged module.

FIG. 10B is a perspective view of another embodiment of a packaged module 1020. The module 1020 includes a laminated substrate 1010 and a semiconductor die 1012. The semiconductor die 1012 includes at least one of a front end system 945 or a transceiver 946. For example, the front end system 945 can include signal conditioning circuits, such as controllable amplifiers and/or controllable phase shifters, to aid in providing beamforming. The packaged module 1020 can be implemented in accordance with any of the embodiments herein.

In the illustrated the embodiment, cavity-based antennas 1011a-1011p have been formed on an edge 1022 of the laminated substrate 1010. In this example, sixteen cavity-based antennas have been provided in a four-by-four (4×4) array. However, more or fewer antennas can be included and/or antennas can be arrayed in other patterns.

In another embodiment, the laminated substrate 1010 further include another antenna array (for example, a patch antenna array) formed on a second major surface of the laminated substrate 1010 opposite the first major surface 1021. Implementing the module 1020 aids in increasing a range of angles over which the module 1020 can communicate.

The module 1020 illustrates another embodiment of a module including an array of antennas that are controllable to provide beamforming. Implementing an array of antennas on a side of module aids in communicating at certain angles and/or directions that may otherwise be unavailable due to environmental blockage. Although an example with cavity-based antennas is shown, the teachings herein are applicable to implementations using other types of antennas.

Figure 11:
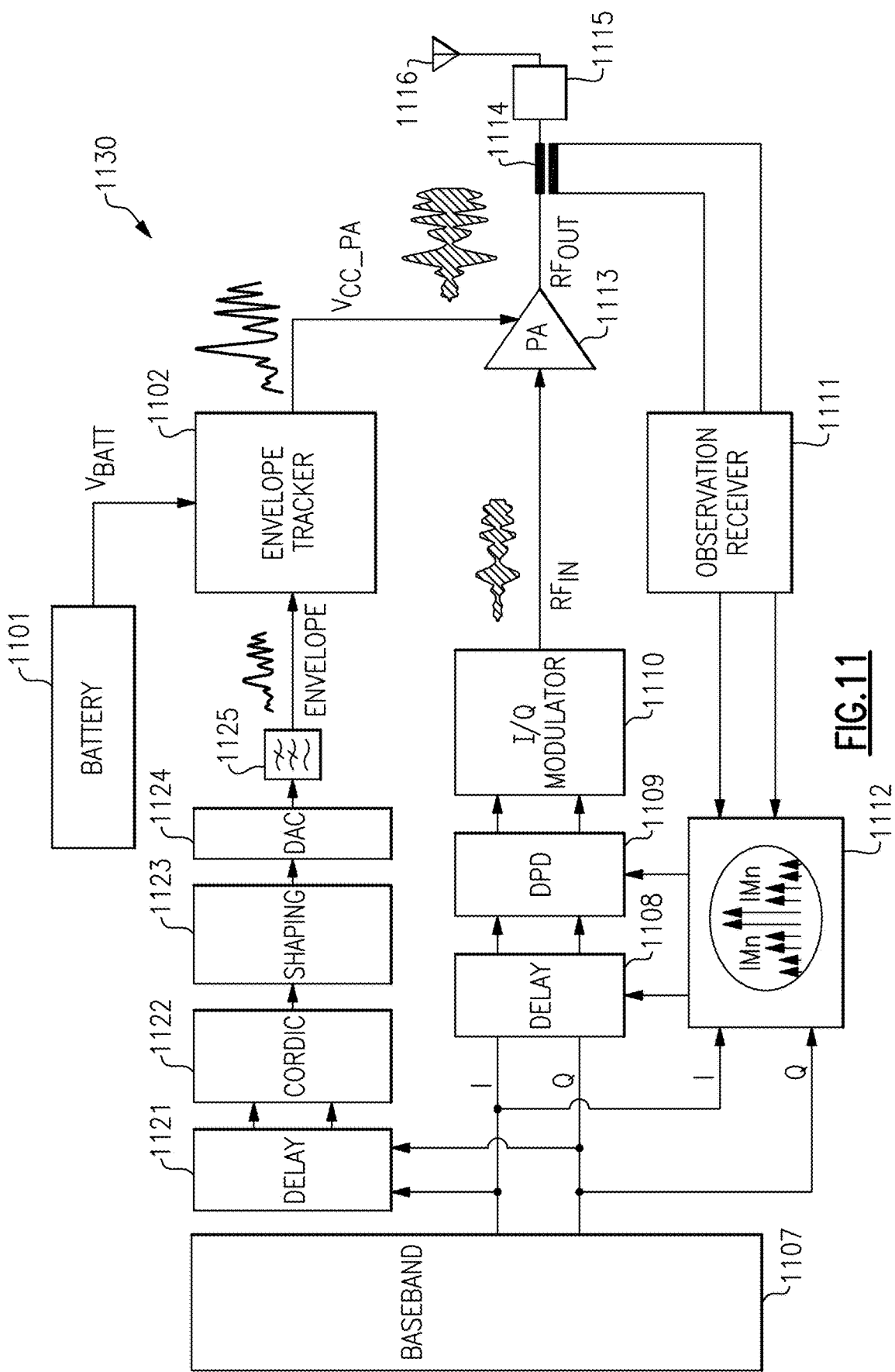
FIG. 11 is a schematic diagram of one embodiment of a communication system for transmitting RF signals.

FIG. 11 is a schematic diagram of one embodiment of a communication system 1130 for transmitting RF signals. The communication system 1130 includes a battery 1101, an envelope tracker 1102, a baseband processor 1107, a signal delay circuit 1108, a digital pre-distortion (DPD) circuit 1109, an I/Q modulator 1110, an observation receiver 1111, an intermodulation detection circuit 1112, a power amplifier 1113, a directional coupler 1114, a duplexing and switching circuit 1115, an antenna 1116, an envelope delay circuit 1121, a coordinate rotation digital computation (CORDIC) circuit 1122, a shaping circuit 1123, a digital-to-analog converter 1124, and a reconstruction filter 1125. The communication system 1130 can be implemented in accordance with any of the embodiments herein.

The communication system 1130 of FIG. 11 illustrates one example of an RF system operating with a power amplifier supply voltage controlled using envelope tracking. However, envelope tracking systems can be implemented in a wide variety of ways.

The baseband processor 1107 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 1110 in a digital format. The baseband processor 1107 can be any suitable processor configured to process a baseband signal. For instance, the baseband processor 1107 can include a digital signal processor, a microprocessor, a programmable core, or any combination thereof.

The signal delay circuit 1108 provides adjustable delay to the I and Q signals to aid in controlling relative alignment between the envelope signal and the RF signal $RF_{IN}$. The amount of delay provided by the signal delay circuit 1108 is controlled based on amount of intermodulation detected by the intermodulation detection circuit 1112.

The DPD circuit 1109 operates to provide digital shaping to the delayed I and Q signals from the signal delay circuit 1108 to generate digitally pre-distorted I and Q signals. In the illustrated embodiment, the pre-distortion provided by the DPD circuit 1109 is controlled based on amount of intermodulation detected by the intermodulation detection circuit 1112. The DPD circuit 1109 serves to reduce a distortion of the power amplifier 1113 and/or to increase the efficiency of the power amplifier 1113.

The I/Q modulator 1110 receives the digitally pre-distorted I and Q signals, which are processed to generate an RF signal $RF_{IN}$. For example, the I/Q modulator 1110 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 1113. In certain implementations, the I/Q modulator 1110 can include one or more filters configured to filter frequency content of signals processed therein.

The envelope delay circuit 1121 delays the I and Q signals from the baseband processor 1107. Additionally, the CORDIC circuit 1122 processes the delayed I and Q signals to generate a digital envelope signal representing an envelope of the RF signal $RF_{IN}$. Although FIG. 11 illustrates an implementation using the CORDIC circuit 1122, an envelope signal can be obtained in other ways.

The shaping circuit 1123 operates to shape the digital envelope signal to enhance the performance of the communication system 1130. In certain implementations, the shaping circuit 1123 includes a shaping table that maps each level of the digital envelope signal to a corresponding shaped envelope signal level. Envelope shaping can aid in controlling linearity, distortion, and/or efficiency of the power amplifier 1113.

In the illustrated embodiment, the shaped envelope signal is a digital signal that is converted by the DAC 1124 to an analog envelope signal. Additionally, the analog envelope signal is filtered by the reconstruction filter 1125 to generate an envelope signal suitable for use by the envelope tracker 1102. In certain implementations, the reconstruction filter 1125 includes a low pass filter.

With continuing reference to FIG. 11, the envelope tracker 1102 receives the envelope signal from the reconstruction filter 1125 and a battery voltage $V_{BATT}$ from the battery 1101, and uses the envelope signal to generate a power amplifier supply voltage $V_{CC\_PA}$ for the power amplifier 1113 that changes in relation to the envelope of the RF signal $RF_{IN}$. The power amplifier 1113 receives the RF signal $RF_{IN}$ from the I/Q modulator 1110, and provides an amplified RF signal $RF_{OUT}$ to the antenna 1116 through the duplexing and switching circuit 1115, in this example.

The directional coupler 1114 is positioned between the output of the power amplifier 1113 and the input of the duplexing and switching circuit 1115, thereby allowing a measurement of output power of the power amplifier 1113 that does not include insertion loss of the duplexing and switching circuit 1115. The sensed output signal from the directional coupler 1114 is provided to the observation receiver 1111, which can include mixers for down converting I and Q signal components of the sensed output signal, and DACs for generating I and Q observation signals from the downconverted signals.

The intermodulation detection circuit 1112 determines an intermodulation product between the I and Q observation signals and the I and Q signals from the baseband processor 1107. Additionally, the intermodulation detection circuit 1112 controls the pre-distortion provided by the DPD circuit 1109 and/or a delay of the signal delay circuit 1108 to control relative alignment between the envelope signal and the RF signal $RF_{IN}$.

By including a feedback path from the output of the power amplifier 1113 and baseband, the I and Q signals can be dynamically adjusted to optimize the operation of the communication system 1130. For example, configuring the communication system 1130 in this manner can aid in providing power control, compensating for transmitter impairments, and/or in performing DPD.

Although illustrated as a single stage, the power amplifier 1113 can include one or more stages. Furthermore, the teachings herein are applicable to communication systems including multiple power amplifiers. In such implementations, separate envelope trackers can be provided for different power amplifiers and/or one or more shared envelope trackers can be used.

Figure 12A:
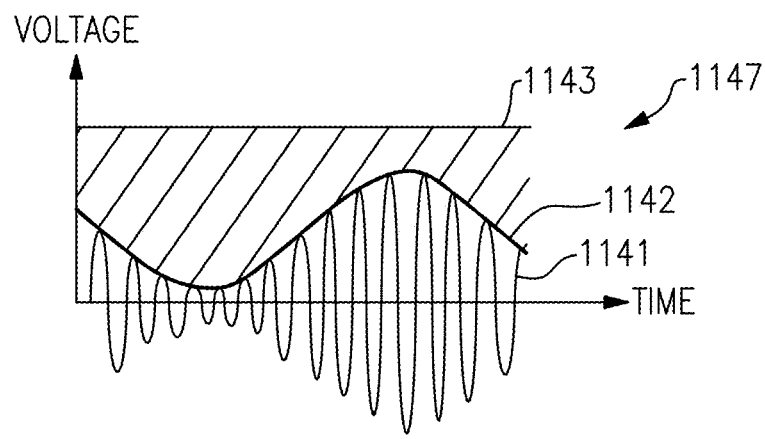
FIG. 12A shows a first example of a power amplifier supply voltage versus time.
Figure 12B:
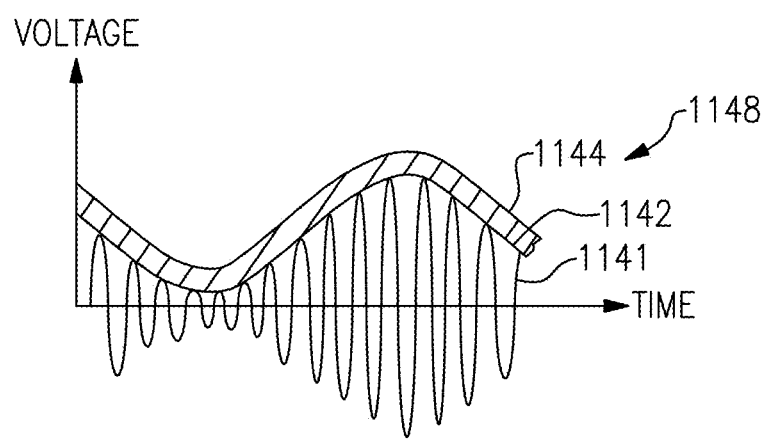
FIG. 12B shows a second example of a power amplifier supply voltage versus time.

FIGS. 12A and 12B show two examples of power amplifier supply voltage versus time.

In FIG. 12A, a graph 1147 illustrates one example of the voltage of an RF signal 1141 and a power amplifier supply voltage 1143 versus time. The RF signal 1141 has an envelope 1142.

It can be important that the power amplifier supply voltage 1143 of a power amplifier has a voltage greater than that of the RF signal 1141. For example, powering a power amplifier using a power amplifier supply voltage that has a magnitude less than that of the RF signal can clip the RF signal, thereby creating signal distortion and/or other problems. Thus, it can be important the power amplifier supply voltage 1143 be greater than that of the envelope 1142. However, it can be desirable to reduce a difference in voltage between the power amplifier supply voltage 1143 and the envelope 1142 of the RF signal 1141, as the area between the power amplifier supply voltage 1143 and the envelope 1142 can represent lost energy, which can reduce battery life and increase heat generated in a wireless device.

In FIG. 12B, a graph 1148 illustrates another example of the voltage of an RF signal 1141 and a power amplifier supply voltage 1144 versus time. In contrast to the power amplifier supply voltage 1143 of FIG. 12A, the power amplifier supply voltage 1144 of FIG. 12B changes in relation to the envelope 1142 of the RF signal 1141. The area between the power amplifier supply voltage 1144 and the envelope 1142 in FIG. 12B is less than the area between the power amplifier supply voltage 1143 and the envelope 1142 in FIG. 12A, and thus the graph 1148 of FIG. 12B can be associated with a power amplifier system having greater energy efficiency.

Figure 13A:
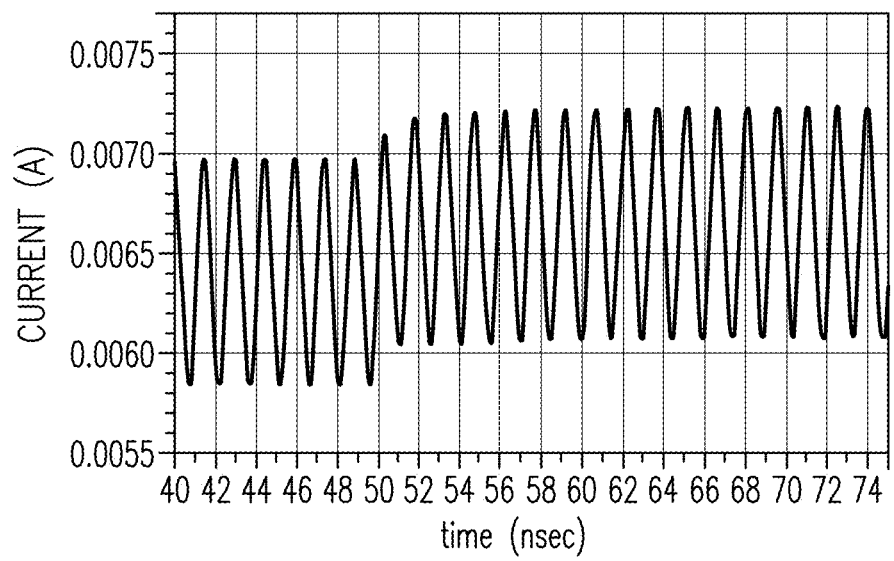
FIG. 13A is one example of a graph of current versus time.
Figure 13B:
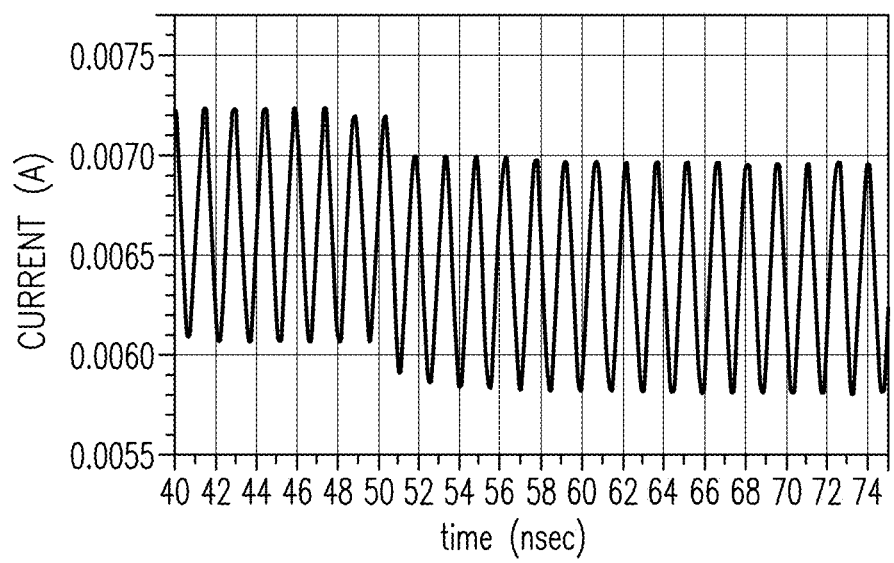
FIG. 13B is another example of a graph of current versus time.
Figure 13C:
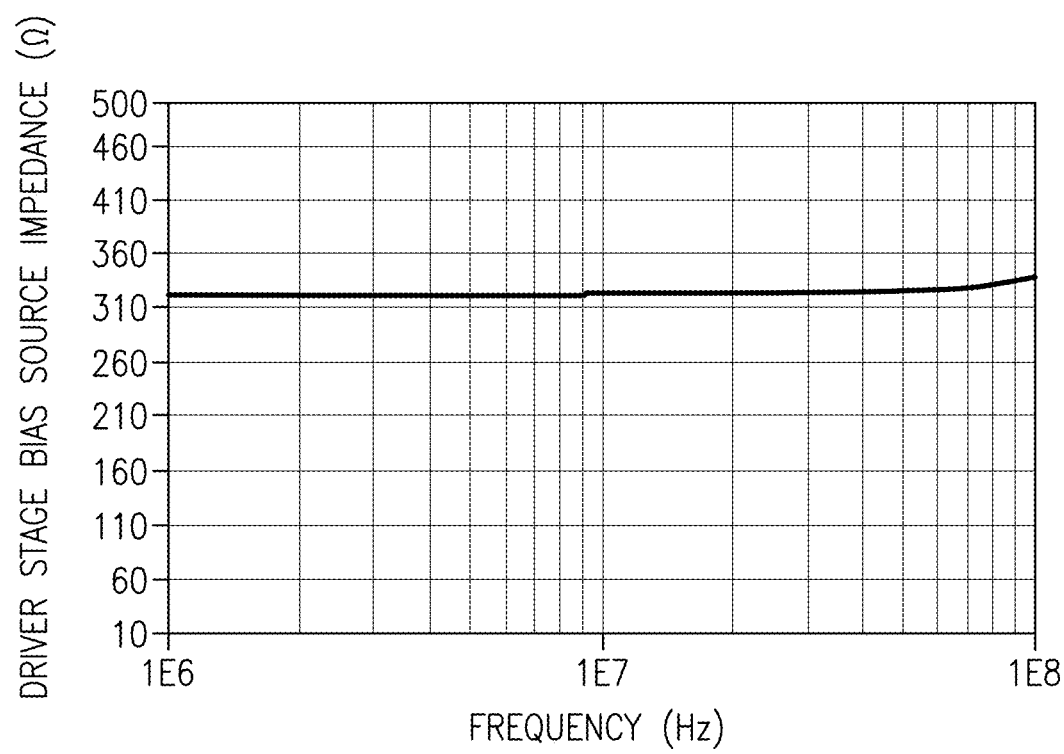
FIG. 13C is one example of a graph of transistor bias source impedance versus frequency.

FIG. 13A is one example of a graph of current versus time. FIG. 13B is another example of a graph of current versus time. FIG. 13C is one example of a graph of transistor bias source impedance versus frequency.

With reference to FIGS. 13A-13C, the graphs corresponds to simulations of one implementation of a class E power amplifier operating with advanced driver gain shaping implemented with 140 MHz (speed 7 ns). In FIG. 13A, power amplifier current is shown when ramping $I_{ADS}$ from 5 µA to 170 µA, while FIG. 13B depicts power amplifier current when ramping $I_{ADS}$ from 170 µA to 5 µA. Additionally, FIG. 13C depicts bias source impedance of the driver stage of the class E power amplifier. The class E power amplifier provides amplification to an RF signal in Band 8 and operates with $V_{CC}$ between 1 V and 5.5 V, in this example.

In this example, the envelope tracker includes a multi-level supply (MLS) envelope tracking system operating with a bandwidth of about 7 MHz. As skilled artisans will appreciate, an MLS envelope tracking system includes a DC-to-DC converter that generates multiple regulated voltages of different voltage levels, and a modulator that controls the supply voltage of a power amplifier by controlling selection of the regulated voltages over time based on the envelope signal.

Figure 14A:
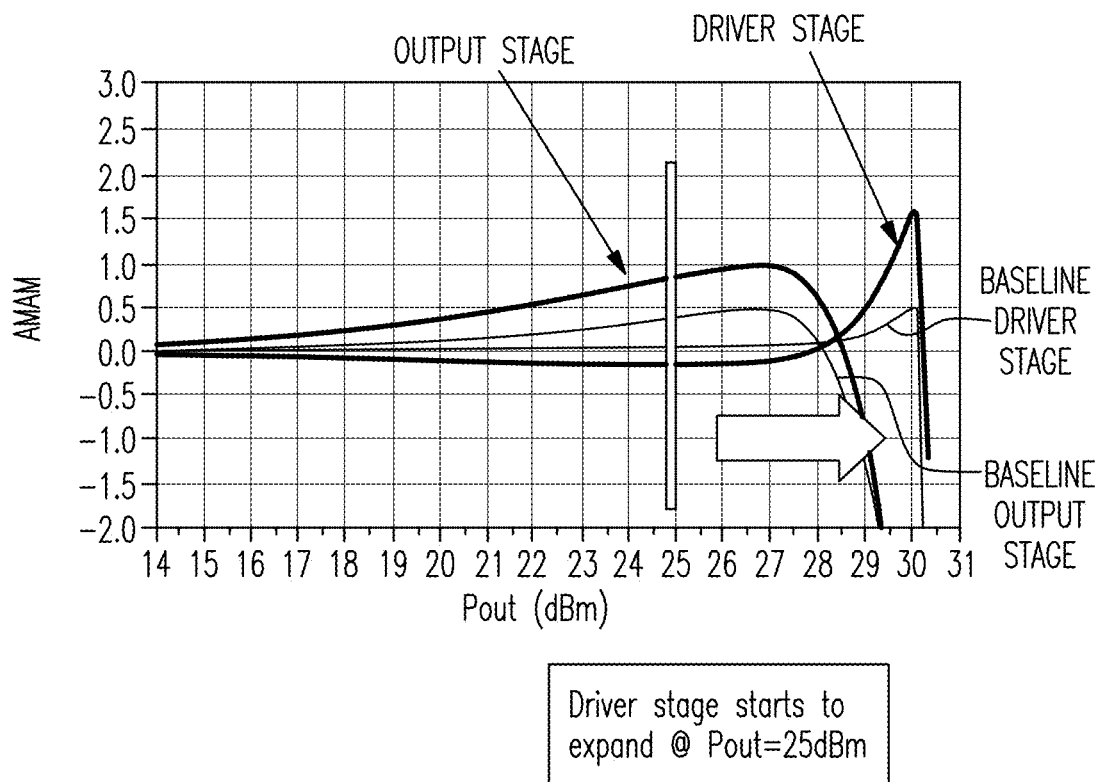
FIG. 14A is one example of a graph of amplitude distortion versus output power for various implementations of class E power amplifiers.
Figure 14B:
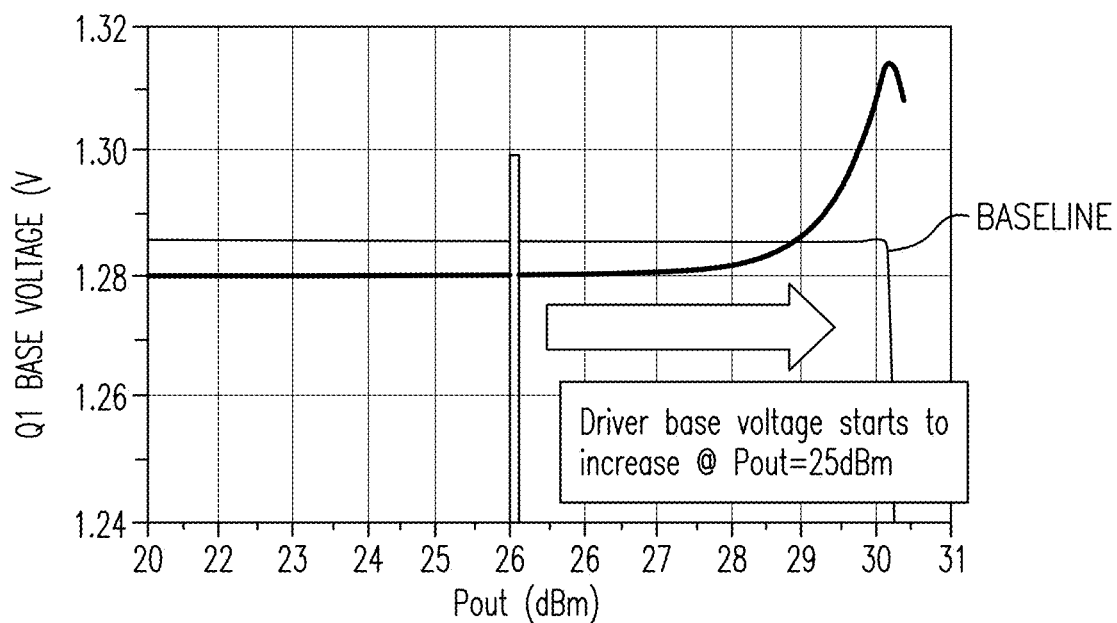
FIG. 14B is one example of a graph of driver stage base voltage versus output power for various implementations of class E power amplifiers.
Figure 14C:
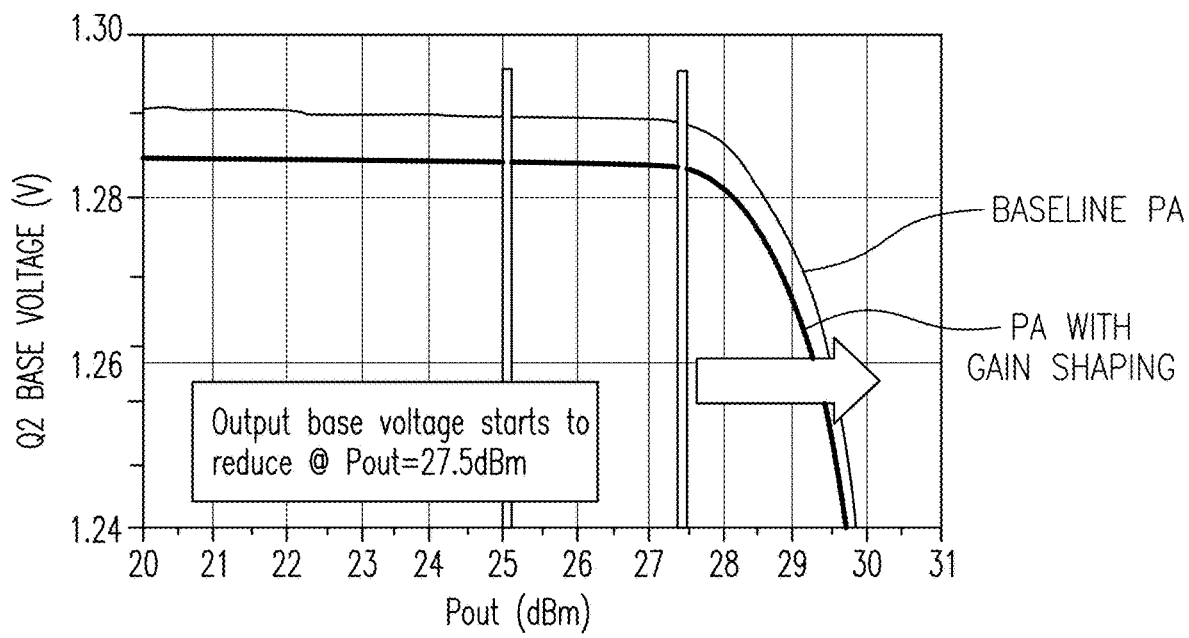
FIG. 14C is one example of a graph of output stage base voltage versus output power for various implementations of class E power amplifiers.
Figure 14D:
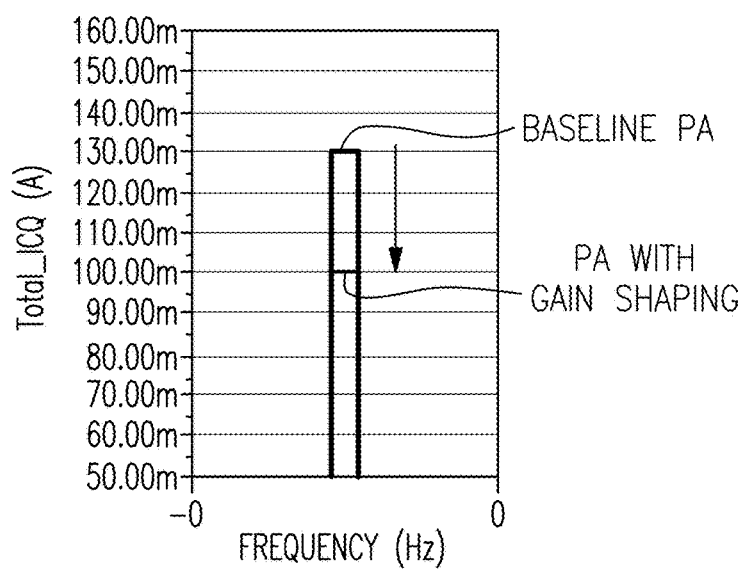
FIG. 14D is one example of current versus frequency for various implementations of class E power amplifiers.

FIG. 14A is one example of a graph of amplitude distortion versus output power for various implementations of class E power amplifiers. FIG. 14B is one example of a graph of driver stage base voltage versus output power for various implementations of class E power amplifiers. FIG. 14C is one example of a graph of output stage base voltage versus output power for various implementations of class E power amplifiers. FIG. 14D is one example of current versus frequency for various implementations of class E power amplifiers.

With reference to FIGS. 14A-14D, the simulations correspond to one example of simulation results for a class E power amplifier with gain shaping relative to a class E power amplifier without gain shaping. The class E power amplifier operates with a supply voltage of 3V and amplifies an RF signal in Band 8, in this example.

In the illustrated example, at an output power (Pout) of about 25 dBm, the gain of bipolar transistor Q1 starts to expand and the base voltage starts to increase (Q1 gain shaping start). Additionally, at Pout of about 27.5 dBm, bipolar transistor Q2 gain starts to compress and base voltage start to decrease. In this example, Q1 gain shaping starts before Q2 starts to compress. Thus, it would be too late to couple Q2 base voltage and drive Q1 bias for Q1 gain shaping.

Figure 15A:
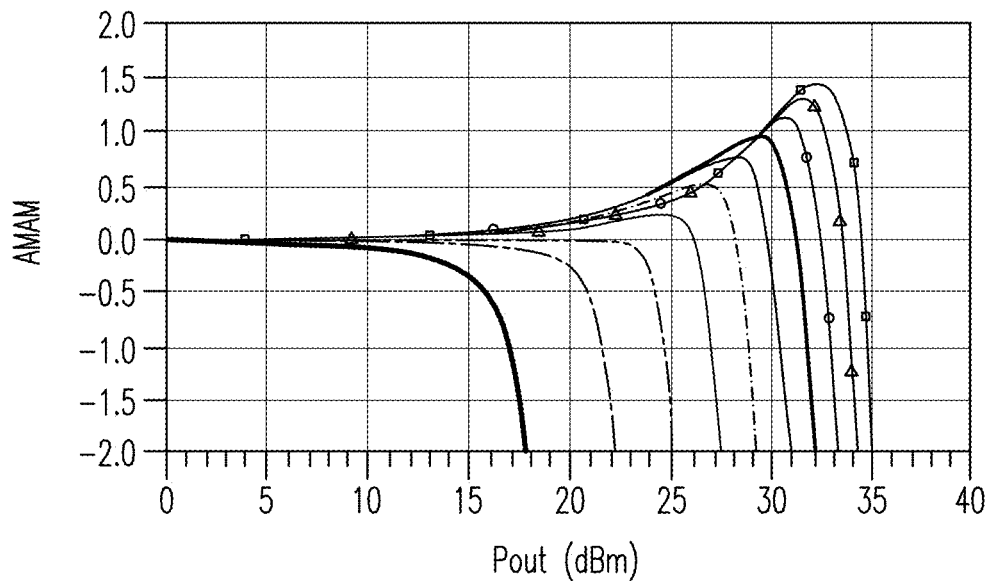
FIG. 15A is one example of a graph of normalized amplitude distortion versus output power for a class E power amplifier operating at various supply voltage levels.
Figure 15B:
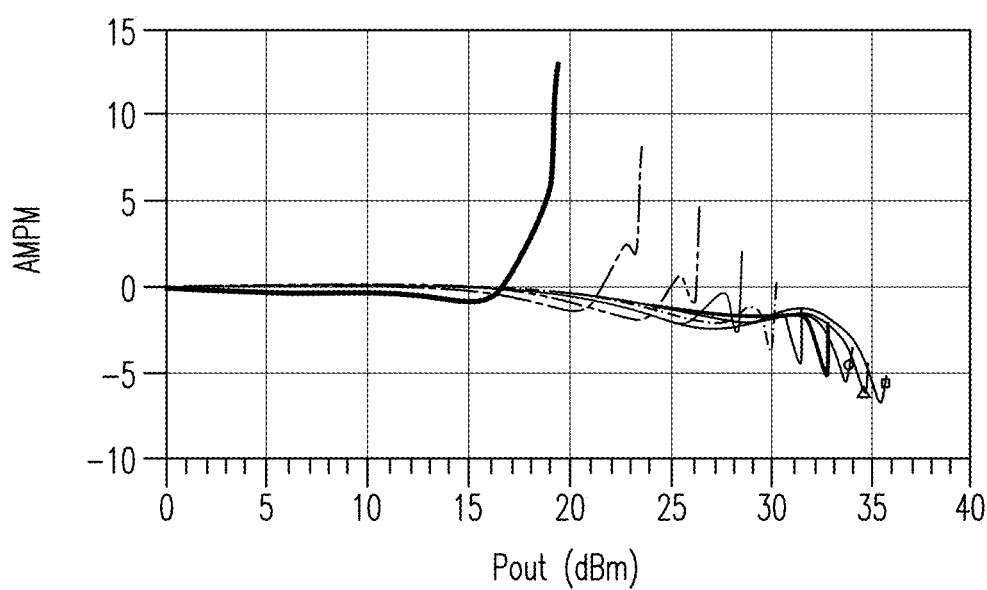
FIG. 15B is one example of a graph of normalized phase distortion versus output power for a class E power amplifier operating at various supply voltage levels.

FIG. 15A is one example of a graph of normalized amplitude distortion versus output power for a class E power amplifier operating at various supply voltage levels. FIG. 15B is one example of a graph of normalized phase distortion versus output power for a class E power amplifier operating at various supply voltage levels.

With reference to FIGS. 15A-15B, the simulations correspond to one example of simulation results for a class E power amplifier without gain shaping. The class E power amplifier operates with a supply voltage varying from 1 V to 5.5 V and amplifies an RF signal in Band 8, in this example.

Figure 16A:
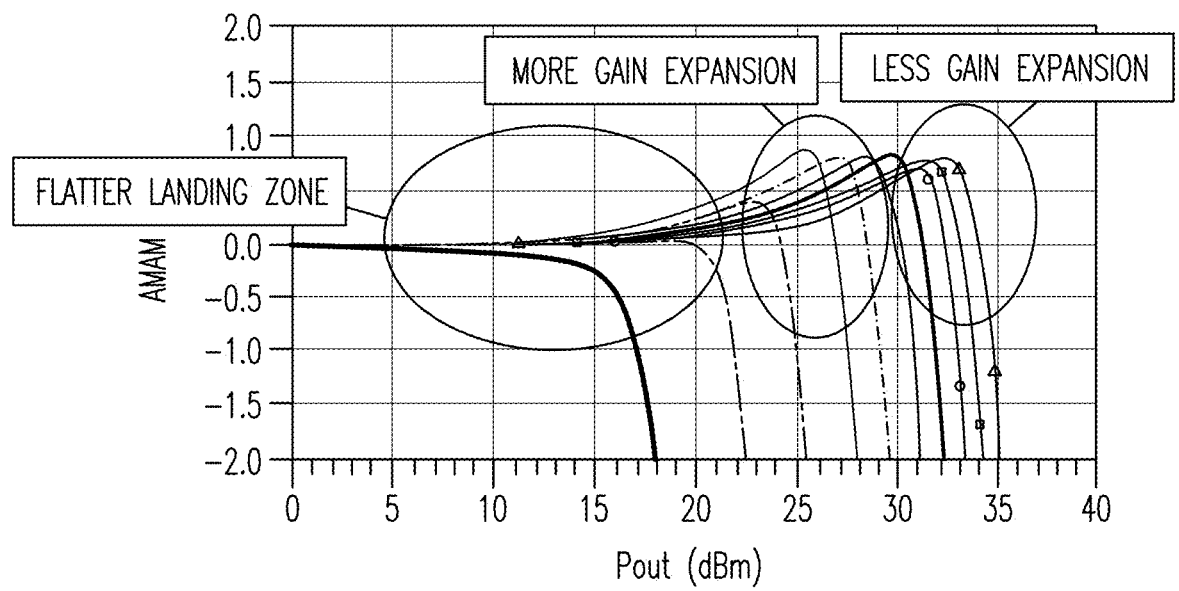
FIG. 16A is another example of a graph of normalized amplitude distortion versus output power for a class E power amplifier operating at various supply voltage levels.
Figure 16B:
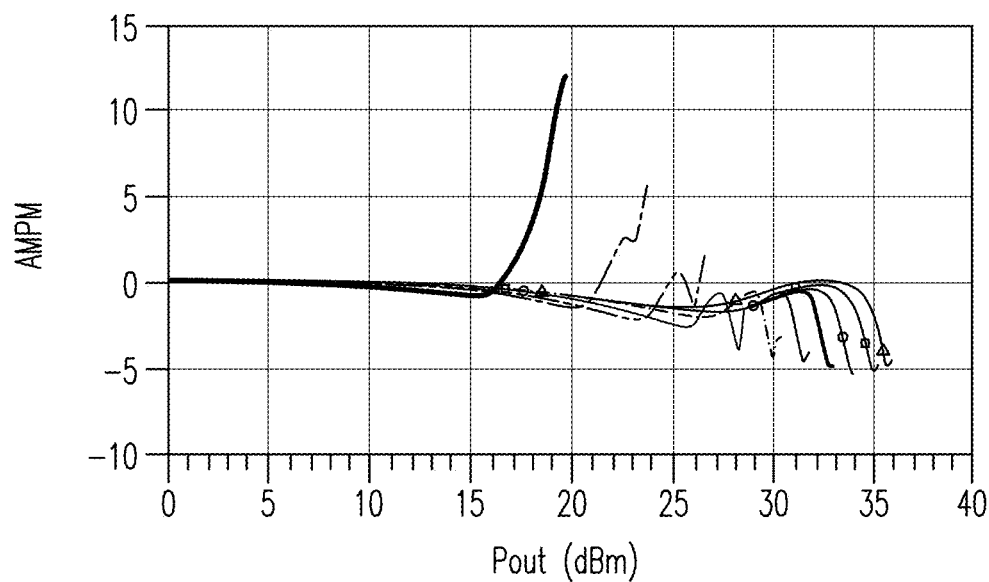
FIG. 16B is another example of a graph of normalized phase distortion versus output power for a class E power amplifier operating at various supply voltage levels.

FIG. 16A is another example of a graph of normalized amplitude distortion versus output power for a class E power amplifier operating at various supply voltage levels. FIG. 16B is another example of a graph of normalized phase distortion versus output power for a class E power amplifier operating at various supply voltage levels.

The simulations of FIGS. 16A and 16B correspond to one example of simulation results for a class E power amplifier with advanced gain shaping. The class E power amplifier operates with a supply voltage varying from 1 V to 5.5 V and amplifies an RF signal in Band 8, in this example.

With reference to FIGS. 15A-16B, both amplitude distortion (AM/AM) and phase distortion (AM/PM) are improved by using advanced gain shaping. Furthermore, higher VCC gain expansion is provided to improve linearity. Additionally, a flatter landing zone is provided at low VCC, and less gain expansion is provided at high VCC. Thus, gain expansion table for each VCC can be selected depending on the linearity margin.

FIG. 17A is one example of measurement results of gain versus output power for a class E power amplifier operating at various supply voltage levels. FIG. 17B is another example of measurement results of gain versus output power for a class E power amplifier operating at various supply voltage levels. The measurement results correspond to a one implementation of a class E power amplifier with advanced gain shaping.

With reference to FIGS. 17A and 17B, the measurements results depict similar characteristics as the simulation results.

Applications

The principles and advantages of the embodiments described herein can be used for a wide variety of applications.

For example, power amplifier systems can be included in a wide range of radio frequency electronics including, but not limited to, a base station, a wireless network access point, a mobile phone (for instance, a smartphone), a tablet, a vehicle, a computer, and/or an Internet of things (IoT) device.

CONCLUSIONS

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a power amplifier configured to amplify a radio frequency signal and to receive power from a supply voltage;
an envelope tracker configured to control a voltage level of the supply voltage of the power amplifier based on an envelope of the radio frequency signal;
a current controller configured to receive power from the supply voltage and to generate a gain shaping current that changes based on the voltage level of the supply voltage, the current controller further configured to generate a reference current; and
a power amplifier biasing circuit configured to bias the power amplifier based on combining the reference current and the gain shaping current.

2. The power amplifier system of claim 1 wherein the current controller includes a look-up table mapping the voltage level of the supply voltage to the gain shaping current.

3. The power amplifier system of claim 1 wherein the current controller reduces the gain shaping current in response to an increase in the voltage level of the supply voltage.

4. The power amplifier system of claim 1 wherein the current controller includes a plurality of current steering circuits each configured to control the gain shaping current.

5. The power amplifier system of claim 4 wherein the current controller includes a regulator configured to generate a plurality of reference voltages of different voltage levels, the plurality of current steering circuits each configured to compare the supply voltage to a corresponding one of the plurality of reference voltages.

6. The power amplifier system of claim 4 wherein the current controller includes a regulator configured to generate a common reference voltage and a resistor ladder configured to receive the supply voltage and to generate a plurality of scaled supply voltages, the plurality of current steering circuits each configured to compare the common reference voltage to a corresponding one of the plurality of scaled supply voltages.

7. The power amplifier system of claim 1 wherein the power amplifier biasing circuit biases a driver stage of the power amplifier.

8. The power amplifier system of claim 1 wherein the power amplifier biasing circuit is configured to provide a bias signal to the power amplifier at a bias output, the power amplifier biasing circuit including a power control circuit configured to control the bias signal based on a plurality of power control signals.

9. The power amplifier system of claim 8 further comprising an input matching network connected between an input terminal and an input to the power amplifier, the power amplifier biasing circuit further including a capacitor configured to couple a portion of the radio frequency signal at the input terminal to the bias output.

10. A method of amplification in a mobile device, the method comprising:
amplifying a radio frequency signal using a power amplifier that is powered by a supply voltage;
controlling a voltage level of the supply voltage of the power amplifier based on an envelope of the radio frequency signal using an envelope tracker;
generating a gain shaping current that changes based on the voltage level of the supply voltage and generating a reference current using a current controller that is powered by the supply voltage; and
biasing the power amplifier based on combining the reference current and the gain shaping current using a power amplifier biasing circuit.

11. The method of claim 10 further comprising mapping the voltage level of the supply voltage to the gain shaping current using a look-up table of the current controller.

12. The method of claim 10 further comprising reducing the gain shaping current in response to an increase in the voltage level of the supply voltage of the power amplifier.

13. The method of claim 10 wherein biasing the power amplifier includes biasing a driver stage of the power amplifier.

14. A mobile device comprising:
a power management system including an envelope tracker configured to control a voltage level of a supply voltage based on an envelope of a radio frequency signal;
a transceiver configured to generate the radio frequency signal; and
a front end system including a power amplifier configured to amplify the radio frequency signal and to receive power from the supply voltage, and a current controller configured to receive power from the supply voltage and to generate a gain shaping current that changes based on the voltage level of the supply voltage, the current controller further configured to generate a reference current, the front end system further including a power amplifier biasing circuit configured to bias the power amplifier based on combining the reference current and the gain shaping current.

15. The mobile device of claim 14 wherein the current controller includes a look-up table mapping the voltage level of the supply voltage to the gain shaping current.

16. The mobile device of claim 14 wherein the current controller reduces the gain shaping current in response to an increase in the voltage level of the supply voltage.

17. The mobile device of claim 14 wherein the current controller includes a plurality of current steering circuits each configured to control the gain shaping current.

18. The mobile device of claim 14 wherein the power amplifier biasing circuit biases a driver stage of the power amplifier.

19. The mobile device of claim 14 wherein the power amplifier biasing circuit is configured to provide a bias signal to the power amplifier at a bias output, the power amplifier biasing circuit including a power control circuit configured to control the bias signal based on a plurality of power control signals.

20. The mobile device of claim 19 wherein the front end system further includes an input matching network connected between an input terminal and an input to the power amplifier, the power amplifier biasing circuit further including a capacitor configured to couple a portion of the radio frequency signal at the input terminal to the bias output.

* * * * *